(12) United States Patent
Lee et al.

(10) Patent No.: US 11,908,231 B2
(45) Date of Patent: Feb. 20, 2024

(54) FINGERPRINT SENSOR AND DISPLAY DEVICE INCLUDING THE SAME

(71) Applicant: Samsung Display Co., LTD., Yongin-si (KR)

(72) Inventors: Sun Hwa Lee, Yongin-si (KR); Ki June Lee, Yongin-si (KR); Mu Kyung Jeon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/106,231

(22) Filed: Feb. 6, 2023

(65) Prior Publication Data

US 2023/0177868 A1    Jun. 8, 2023

Related U.S. Application Data

(63) Continuation of application No. 17/532,887, filed on Nov. 22, 2021, now Pat. No. 11,574,497, which is a
(Continued)

(30) Foreign Application Priority Data

Sep. 26, 2019    (KR) .......................... 10-2019-0119017

(51) Int. Cl.
*G06V 40/13*     (2022.01)
*H10K 59/40*    (2023.01)

(52) U.S. Cl.
CPC ...... *G06V 40/1318* (2022.01); *G06V 40/1329* (2022.01); *H10K 59/40* (2023.02)

(58) Field of Classification Search
CPC ........... G06V 40/1318; G06V 40/1329; G06V 40/1324; G06V 40/12–1394;
(Continued)

(56) References Cited

U.S. PATENT DOCUMENTS

2017/0017824 A1*   1/2017   Smith .................... G02B 6/005
2017/0103248 A1    4/2017   Yamamoto
(Continued)

FOREIGN PATENT DOCUMENTS

CN        108922905        11/2018
CN        110211975        9/2019
(Continued)

OTHER PUBLICATIONS

Extended European Search Report dated Feb. 8, 2021, issued in European Patent Application No. 20197909.3.
(Continued)

*Primary Examiner* — Premal R Patel
(74) *Attorney, Agent, or Firm* — H.C. Park & Associates, PLC

(57) ABSTRACT

A fingerprint sensor and a display device include a substrate. A circuit element layer is disposed on a first surface of the substrate and includes a semiconductor layer, conductive layers and at least one opening portion. A light emitting element layer is disposed on the circuit element layer and includes at least one light emitting element. A sensor layer is disposed on a second surface of the substrate and includes at least one light sensor corresponding to the opening portion. The opening portion is defined by non-overlapping of the semiconductor layer and the conductive layers, the opening portion has a closed loop shape in plan view, and at least a portion of the closed loop shape includes a curve, or an internal angle of the at least a portion of the closed loop shape is an obtuse angle.

20 Claims, 31 Drawing Sheets

Related U.S. Application Data continuation of application No. 16/996,764, filed on Aug. 18, 2020, now Pat. No. 11,182,584.

(58) Field of Classification Search
CPC ........ H10K 59/40; H10K 59/65; G06F 3/041; H01L 27/14678; H01L 27/1214
See application file for complete search history.

(56) References Cited

U.S. PATENT DOCUMENTS

| | | | |
|---|---|---|---|
| 2018/0005007 A1* | 1/2018 | Du | ................. H10K 30/88 |
| 2018/0012069 A1 | 1/2018 | Chung et al. | |
| 2018/0089491 A1* | 3/2018 | Kim | .................. G02B 6/0088 |
| 2018/0150671 A1 | 5/2018 | Choo et al. | |
| 2018/0225500 A1 | 8/2018 | Han | |
| 2020/0026899 A1 | 1/2020 | Sun et al. | |
| 2020/0119108 A1 | 4/2020 | Park et al. | |
| 2020/0210006 A1 | 7/2020 | Son et al. | |
| 2020/0293738 A1* | 9/2020 | Zhang | ................ G06V 40/1318 |
| 2020/0348550 A1* | 11/2020 | Wu | ................... G06V 40/1318 |

FOREIGN PATENT DOCUMENTS

| | | |
|---|---|---|
| EP | 3462498 | 4/2019 |
| KR | 10-2018-0005588 | 1/2018 |
| KR | 10-2018-0061474 | 6/2018 |
| KR | 10-1948870 | 2/2019 |
| KR | 10-2020-0041428 | 4/2020 |
| WO | 2020259647 | 12/2020 |

OTHER PUBLICATIONS

Notice of Allowance dated Jul. 12, 2021, in U.S. Appl. No. 16/996,764.

Notice of Allowance dated Oct. 5, 2022, in U.S. Appl. No. 17/532,887.

* cited by examiner

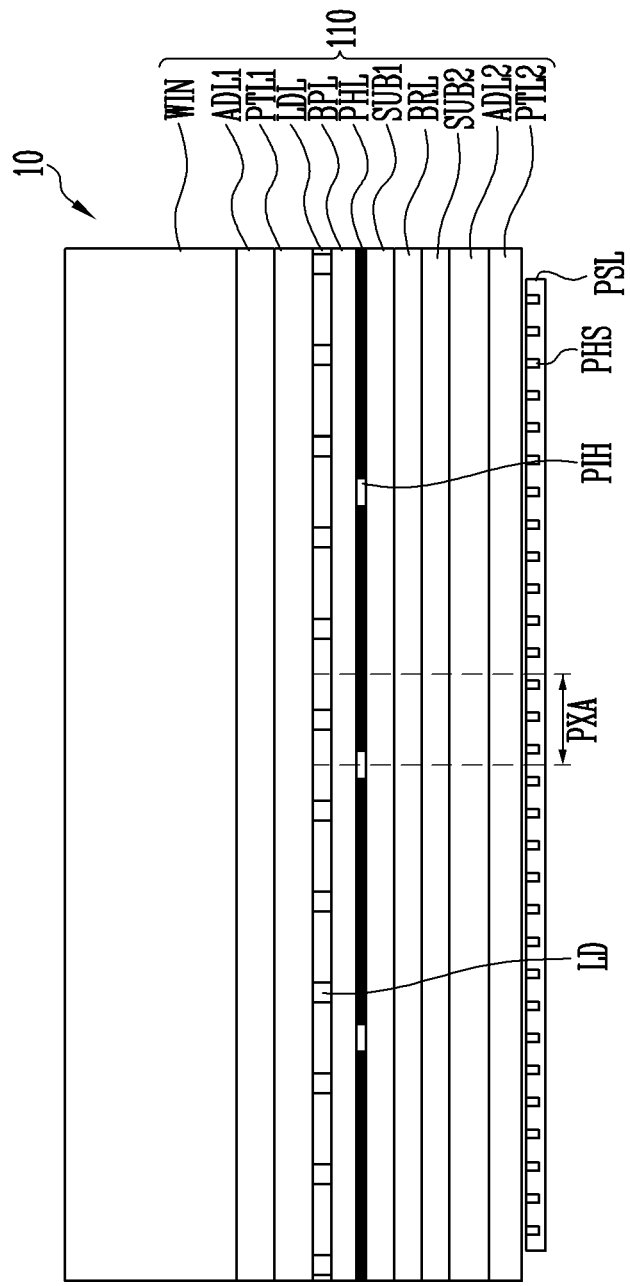

FINGERPRINT SENSOR AND DISPLAY DEVICE INCLUDING THE SAME

CROSS REFERENCE TO RELATED APPLICATION

This application is a Continuation of U.S. patent application Ser. No. 17/532,887, filed Nov. 22, 2021, which is a Continuation of U.S. patent application Ser. No. 16/996,764, filed on Aug. 18, 2020, now U.S. Pat. No. 11,182,584, which claims priority from and the benefit of Korean Patent Application No. 10-2019-0119017, filed on Sep. 26, 2019, which are hereby incorporated by reference for all purposes as if fully set forth herein.

BACKGROUND

Field

Exemplary embodiments of the invention relate generally to a fingerprint sensor and a display device including the same.

Discussion of the Background

In recent years, as a display device such as a smartphone or a tablet PC has been widely used, a biometric information authentication method using a fingerprint of a user has been widely used. In order to provide a fingerprint sensing function, a fingerprint sensor may be provided in a form embedded or attached to a display device.

For example, the fingerprint sensor may be configured with a sensor using a light sensing method. The fingerprint sensor for the light sensing method may include a light source, a lens, and a light sensor array. When such a fingerprint sensor is attached to a display panel, a thickness of the display device may increase and a manufacturing cost may increase.

The above information disclosed in this Background section is only for understanding of the background of the inventive concepts, and, therefore, it may contain information that does not constitute prior art.

SUMMARY

Devices constructed according to exemplary embodiments of the invention are capable of providing a fingerprint sensor using a light sensing method that is capable of reducing a thickness of a module and improving reliability, and a display device including the fingerprint sensor.

In addition, devices constructed according to exemplary embodiments of the invention are capable of providing a fingerprint sensor capable of minimizing incident light diffraction at an edge of an opening portion provided for controlling incident light in a display panel, and a display device including the fingerprint sensor.

Additional features of the inventive concepts will be set forth in the description which follows, and in part will be apparent from the description, or may be learned by practice of the inventive concepts.

A fingerprint sensor according to one or more exemplary embodiments of the inventive concepts includes a substrate, a circuit element layer disposed on a first surface of the substrate and including a semiconductor layer, conductive layers and at least one opening portion, a light emitting element layer disposed on the circuit element layer and including at least one light emitting element, and a sensor layer disposed on a second surface of the substrate and including at least one light sensor corresponding to the opening portion. The opening portion is defined by non-overlapping of the semiconductor layer and the conductive layers, the opening portion has a closed loop shape in plan view, and at least a portion of the closed loop shape includes a curve, or an internal angle of the at least a portion of the closed loop shape is an obtuse angle.

According to an embodiment, the conductive layers may include a first conductive layer including first electrodes extending in a first direction, a second conductive layer disposed on the first conductive layer and including second electrodes extending in the first direction, and a third conductive layer disposed on the second conductive layer and including third electrodes extending in a second direction perpendicular to the first direction, and the opening portion may be positioned between the first electrodes, between the second electrodes, and between the third electrodes in plan view.

According to an embodiment, the first electrodes may include a first wire extending in the first direction, the second electrodes may include a second wire spaced apart from the first wire in plan view by a preset distance and extending in the first direction, the third electrodes may include a third wire extending in the second direction perpendicular to the first direction, and a bridge pattern spaced apart from the third wire, and the opening portion may be defined by a portion of the first wire, a portion of the second wire, a portion of the third wire, and a portion of the bridge pattern.

According to an embodiment, the third wire may include at least two first protrusion portions protruding toward the bridge pattern in plan view, and the at least a portion of the closed loop shape may be defined by the at least two first protrusion portions.

According to an embodiment, the first protrusion portions may partially overlap the first wire and the second wire, respectively.

According to an embodiment, the internal angle of the closed loop shape corresponding to each of the first protrusion portions may be an obtuse angle.

According to an embodiment, one side of each of the first protrusion portions may extend in a direction crossing each of the first direction and the second direction.

According to an embodiment, at least one of the first protrusion portions may have a trapezoidal planar shape.

According to an embodiment, the second wire may include at least one second protrusion portion protruding toward the first wire in plan view, the second protrusion portion may not overlap the third wire, and the first and second protrusion portions may correspond to the at least a portion of the closed loop shape.

According to an embodiment, the bridge pattern may include at least one third protrusion portion protruding toward the third wire in plan view, the third protrusion portion may overlap the first wire, and the first to third protrusion portions may correspond to the at least a portion of the closed loop shape.

According to an embodiment, the opening portion may have an octagonal planar shape.

According to an embodiment, the first wire may include at least one fourth protrusion portion protruding in the second direction, and the fourth protrusion portion may include a curve portion corresponding to the curve of the closed loop shape.

According to an embodiment, the second wire may include a fifth protrusion portion protruding in a direction opposite to the second direction, and the fifth protrusion portion may include a curve portion that faces the fourth protrusion portion and corresponds to the curve of the closed loop shape.

According to an embodiment, the opening portion may have a planar shape of a circle or an ellipse.

According to an embodiment, the third wire may include at least two groove portions, the groove portions may partially overlap the first wire and the second wire, respectively, and the internal angle of the closed loop shape corresponding to the groove portions is an acute angle.

According to an embodiment, the second wire may not overlap the bridge pattern.

According to an embodiment, the semiconductor layer may include active patterns including each of a source electrode and a drain electrode, and the opening portion may be further defined by a portion of the active patterns.

In order to achieve an object of the invention, a display device according to embodiments includes a substrate on which a pixel is disposed, a circuit element layer disposed on a first surface of the substrate and including conductive layers on which circuit elements of the pixel are disposed, a light emitting element layer disposed on the circuit element layer and including at least one light emitting element configuring the pixel, and a sensor layer disposed on a second surface of the substrate and including at least one light sensor. At least one opening portion having a closed loop shape in plan view may be defined by non-overlapping of the conductive layers, and at least a portion of the closed loop shape may include a curve, or an internal angle of the at least a portion of the closed loop shape may be an obtuse angle.

According to an embodiment, the conductive layers may include a first conductive layer including a light emission control line extending in a first direction, a second conductive layer disposed on the first conductive layer, spaced apart from the light emission control line at a preset distance in plan view, and including an initialization power line extending in the first direction, and a third conductive layer disposed on the second conductive layer, and including a power line extending in a second direction perpendicular to the first direction and a bridge pattern spaced apart from the power line, and the opening portion may be defined by a portion of the light emission control line, a portion of the initialization power line, a portion of the power line, and a portion of the bridge pattern.

According to an embodiment, the initialization power line may include at least one second protrusion portion protruding toward the light emission control line in plan view, the power line may include at least two first protrusion portions protruding toward the bridge pattern in plan view, the bridge pattern may include at least one third protrusion portion protruding toward the power line in plan view, and the first to fourth protrusion portions may configure the at least a portion of the closed loop shape.

The fingerprint sensor and the display device including the same according to exemplary embodiments of the inventive concepts may reduce a module thickness of the display device by forming a light transmission area integrally with the circuit element layer in the fingerprint sensor for the light sensing method.

In addition, the fingerprint sensor and the display device including the same according to exemplary embodiments of the inventive concepts may prevent or reduce diffraction of light that may occur in the light transmission area formed in the circuit element layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIGS. 7, 8, 9, 10, 11, 12A, 12B, and 12C are cross-sectional views of a display device according to other embodiments of the inventive concepts.

DETAILED DESCRIPTION

Figure 1:
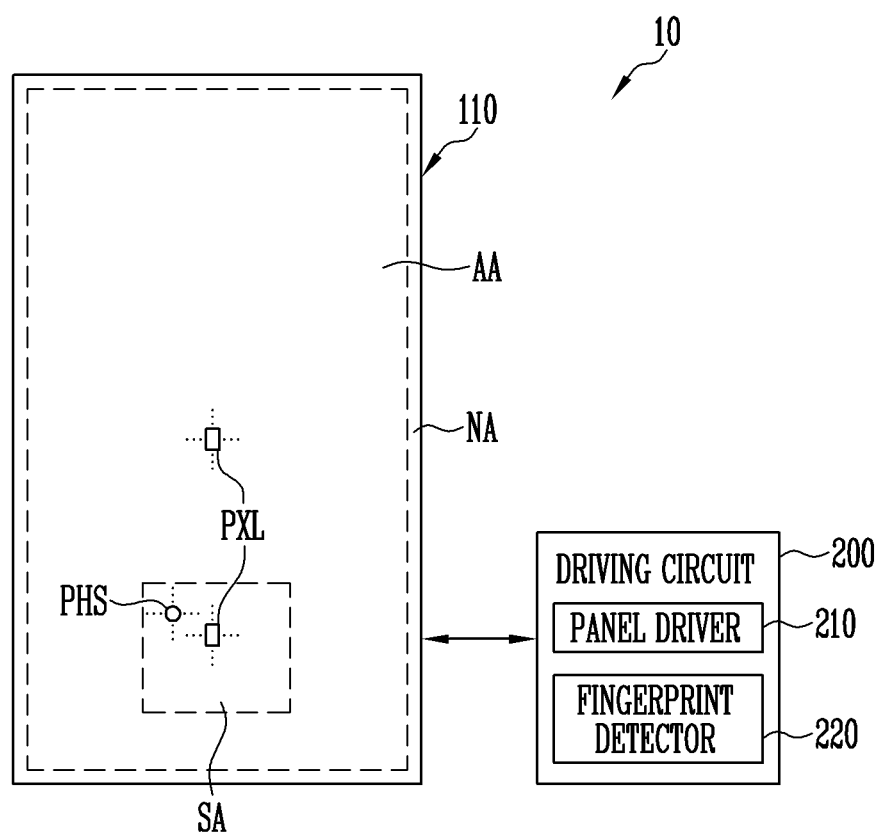
FIGS. 1 and 2 are plan views schematically illustrating a display device according to an exemplary embodiment of the inventive concepts.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As is customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
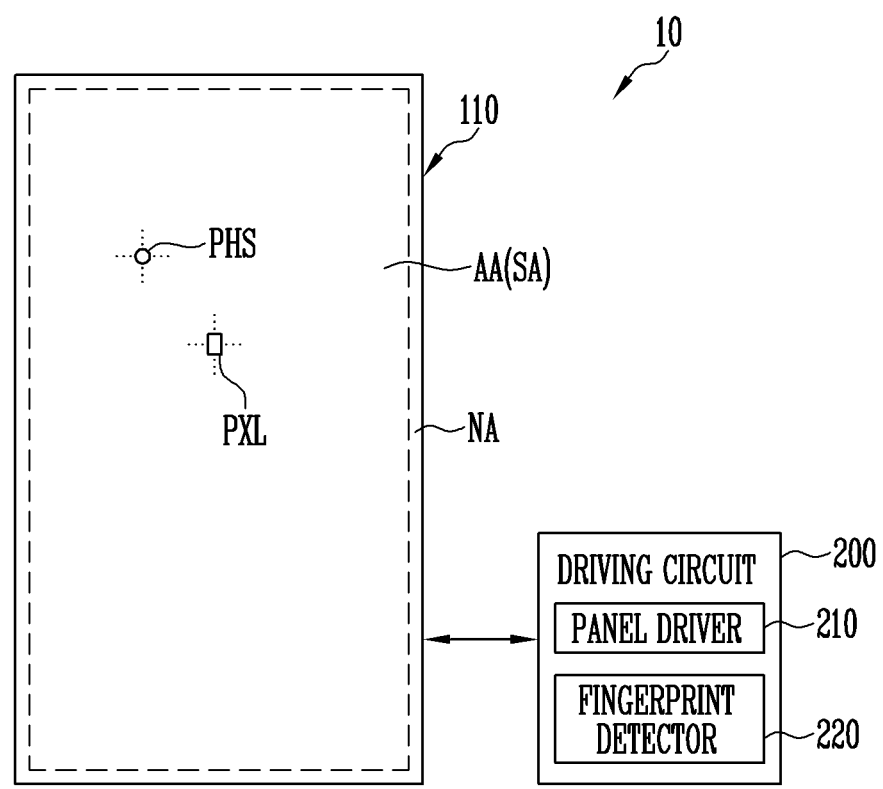

FIGS. 1 and 2 are diagrams schematically illustrating a display device according to an exemplary embodiment of the inventive concepts. More specifically, FIGS. 1 and 2 are diagrams schematically illustrating a display panel included in the display device according to an exemplary embodiment of the inventive concepts and a driving circuit for driving the display panel. For convenience, in FIGS. 1 and 2, the display panel and the driving circuit are separate from each other, but the inventive concepts are not limited thereto. More specifically, all or a part of the driving circuit may be integrally implemented on the display panel.

Referring to FIGS. 1 and 2, the display device 10 includes the display panel 110 and the driving circuit 200 for driving the display panel 110.

The display panel 110 includes a display area AA and a non-display area NA. The display area AA is an area where a plurality of pixels PXL (which may be referred to as sub pixels) are provided, and may be referred to as an active area. In various embodiments, each of the pixels PXL may include at least one light emitting element. The display device 10 displays an image on the display area AA by driving the pixels PXL in correspondence with externally input image data.

In various embodiments, the display area AA may include a sensing area SA. The sensing area SA may include at least some of the pixels PXL of the pixels PXL provided in the display area AA.

In an embodiment, at least a portion of the display area AA may be set as the sensing area SA, as shown in FIG. 1. In another example, the entire display area AA may be set as the sensing area SA as shown in FIG. 2.

Meanwhile, although FIG. 1 shows an example in which only one sensing area SA is formed on the display area AA, the inventive concepts are not limited thereto. That is, in various embodiments, a plurality of regularly or irregularly arranged sensing areas SA may be formed on the display area AA. In such an embodiment, the plurality of sensing areas SA may have the same or different areas and shapes.

In addition, although FIG. 1 shows an example in which the sensing area SA is formed in at least a portion of the display area AA, but the inventive concepts are not limited thereto. That is, in various embodiments, the display area AA and the sensing area SA may be provided so as to overlap only at least portions of the display area AA and the sensing area SA.

The non-display area NA is an area disposed around the display area AA and may be referred to as a non-active area. In various embodiments, the non-display area NA may comprehensively mean an area other than the display area AA on the display panel 110. In an embodiment, the non-display area NA may include a wire area, a pad area, various dummy areas, and the like.

In various embodiments, the display device 10 may further include a plurality of light sensors PHS provided in the sensing area SA. In an embodiment, the light sensors PHSs may sense that light emitted from a light source is reflected by a user's finger and analyze reflected light to sense a fingerprint of a user. Hereinafter, the inventive concepts will be described by using an example in which the light sensors PHS are used for a fingerprint sense purpose, but in various embodiments, the light sensors PHS may be used for the purpose of performing various functions such as a touch sensor or a scanner.

In various embodiments, the light sensors PHS may be disposed on the sensing area SA. At this time, the light sensors PHS may overlap at least a part or all of the pixels PXL provided on the sensing area SA, or may be disposed around the pixels PXL. For example, at least some or all of the light sensors PHS may be provided between the pixels PXL. Various embodiments of a disposition relationship between the light sensor PHS and the pixel PXL will be described in more detail with reference to FIGS. 3A to 3E.

In an embodiment in which the light sensors PHS are provided adjacent to the pixels PXL, the light sensors PHS may use a light emitting element provided in at least one pixel PXL disposed at or around the sensing area SA as a light source. In such an embodiment, the light sensors PHS may configure a fingerprint sensor for a light sensing method together with the pixels PXL of the sensing area SA, particularly the light emitting elements provided in the pixels PXL. As described above, when the fingerprint sensor built-in type display device is configured by using the pixels PXL as the light source without a separate external light source, a module thickness of the fingerprint sensor for the light sensing method and the display device including the fingerprint sensor may be reduced, and a manufacturing cost may be reduced.

In various embodiments, the light sensors PHS may be disposed on a rear surface (for example, a back surface) of two surfaces of the display panel 110, which is opposite to a surface (for example, a front surface) where the image is displayed. However, the inventive concepts are not limited thereto.

The driving circuit 200 may drive the display panel 110. For example, the driving circuit 200 may output a data signal corresponding to the image data to the display panel 110, or may output a driving signal for the light sensor PHS and receive a sensing signal received from the light sensor PHS. The driving circuit 200 receiving the sensing signal may detect a fingerprint form of the user using the sensing signal.

In various embodiments, the driving circuit 200 may include a panel driver 210 and a fingerprint detector 220. For convenience, in FIGS. 1 and 2, the panel driver 210 and the fingerprint detector 220 are separate from each other, but the inventive concepts are not limited thereto. For example, at least a part of the fingerprint detector 220 may be integrated with the panel driver 210 or may operate in conjunction with the panel driver 210.

The panel driver 210 may sequentially supply the data signals corresponding to the image data to the pixels PXL while sequentially scanning the pixels PXL of the display area AA. Then, the display panel 110 may display the image corresponding to the image data.

In an embodiment, the panel driver 210 may supply a driving signal for fingerprint sensing to the pixels PXL. The driving signal may be provided so that the pixels PXL emit light and operate as the light source for the light sensor PHS. In such an embodiment, the driving signal for the fingerprint sensing may be provided to the pixels PXL provided in a specific area within the display panel 110, for example, the pixels PXL provided in the sensing area SA. In various embodiments, the driving signal for the fingerprint sensing may be provided by the fingerprint detector 220.

The fingerprint detector 220 may transfer the driving signal for driving the light sensors PHS to the light sensors PHS and may detect the user fingerprint based on the sensing signal received from the light sensors PHS.

FIGS. 3A, 3B, 3C, 3D, and 3E are plan views illustrating various embodiments of a disposition structure of the pixels and the light sensors. FIGS. 3A to 3E show different embodiments related to a relative size, a resolution, and a disposition relationship between at least one pixel PXL and light sensor PHS provided in the sensing area SA.

Figure 3A:
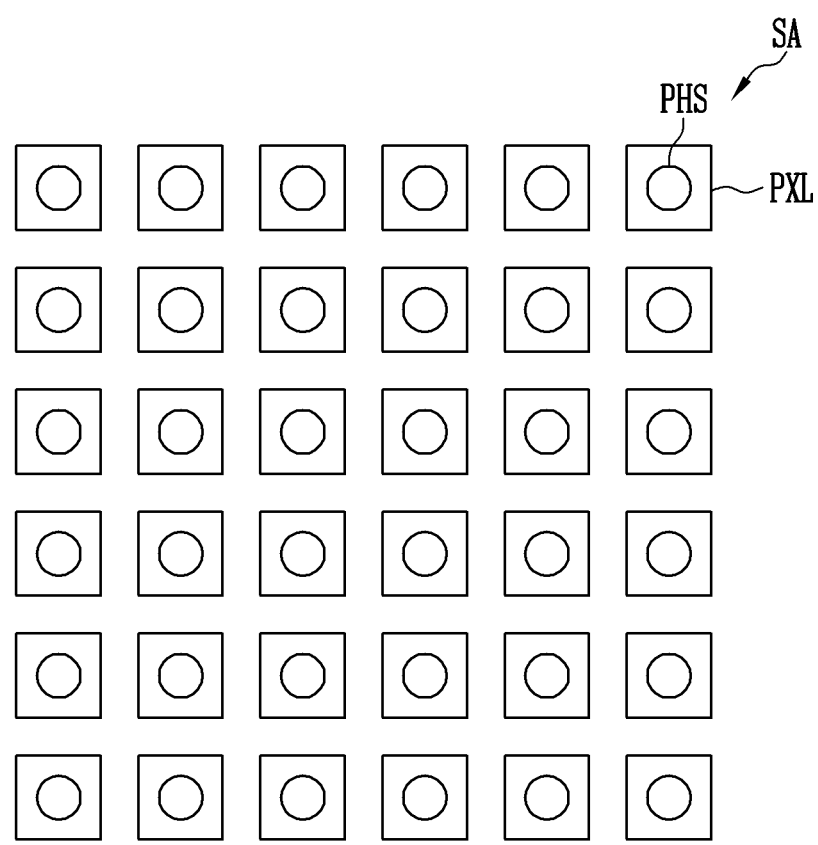
FIGS. 3A, 3B, 3C, 3D, and 3E are plan views illustrating various embodiments of a disposition structure of pixels and light sensors.

Referring to FIG. 3A, in the sensing area SA, the light sensors PHS may be disposed at the same resolution (density) as the pixels PXL. In other words, the same number of light sensors PHS as the pixels PXL may be disposed in the sensing area SA. In such an embodiment, the pixels PXL and the light sensors PHS may be disposed to form a 1:1 pair. In the embodiment of FIG. 3A, the pixels PXL and the light sensors PHS are disposed to overlap with each other, but in other embodiments, the pixels PXL and the light sensors PHS may be disposed so as not to overlap with each other or only portions of the pixels PXL and the light sensors PHS overlap with each other.

Meanwhile, in the embodiment of FIG. 3A, the light sensors PHS has a size smaller than that of the pixels PXL, but the inventive concepts are not limited thereto. That is, in other embodiments, the light sensors PHS may have the same size as the pixels PXL or may have a size larger than that of the pixels PXL. Such an embodiment is shown in FIG. 3E.

Referring to FIGS. 3B to 3E, the light sensors PHS may be disposed at a resolution lower than that of the pixels PXL in the sensing area SA. In other words, the light sensors PHS of the number smaller than that of the pixels PXL may be disposed in the sensing area SA. In FIGS. 3B to 3E, an example in which one light sensor PHS is disposed per four pixels PXL is shown, but the inventive concepts are not limited thereto.

Figure 3B:
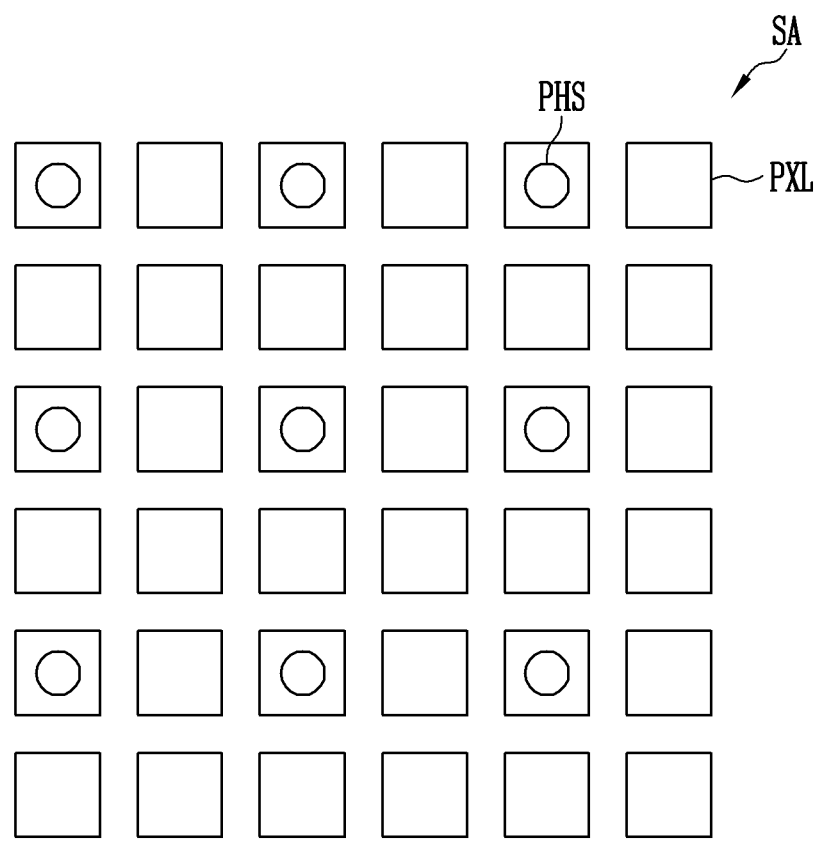
Figure 3C:
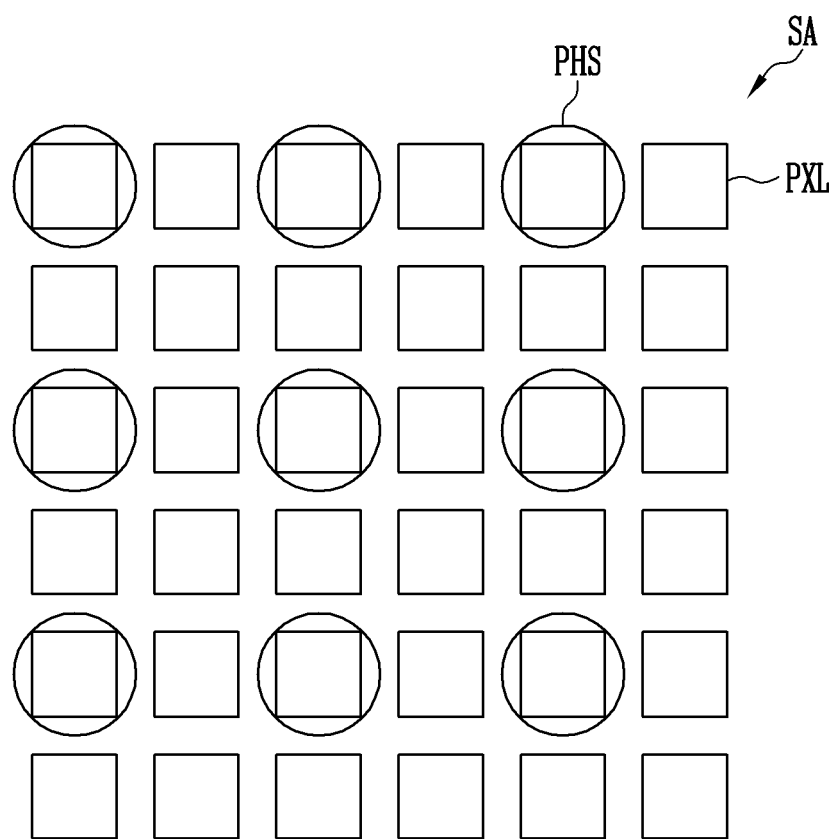
Figure 3D:
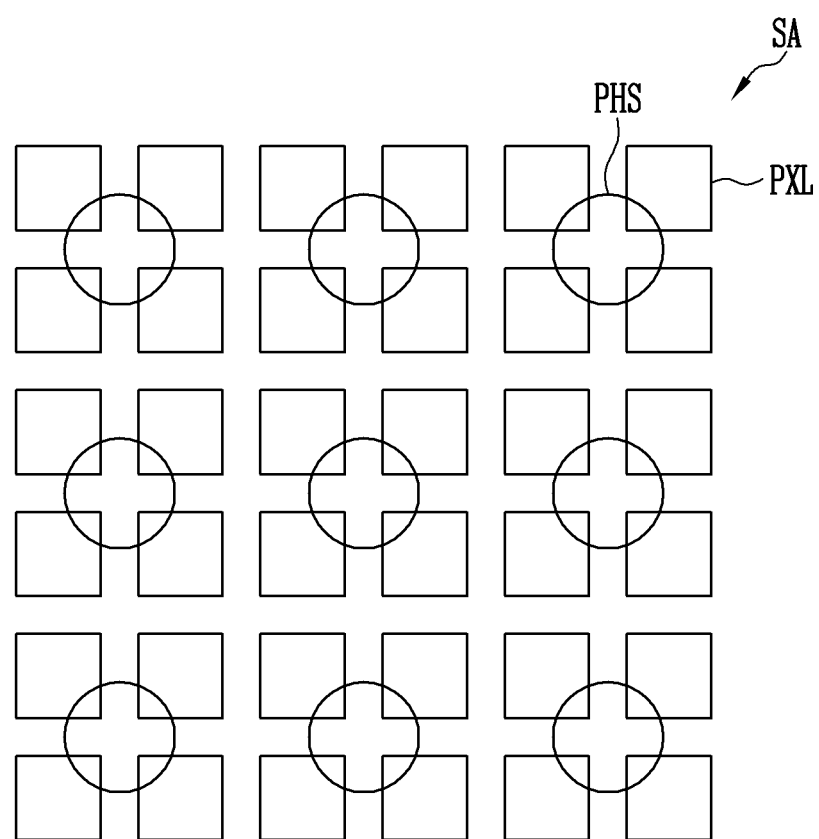
Figure 3E:
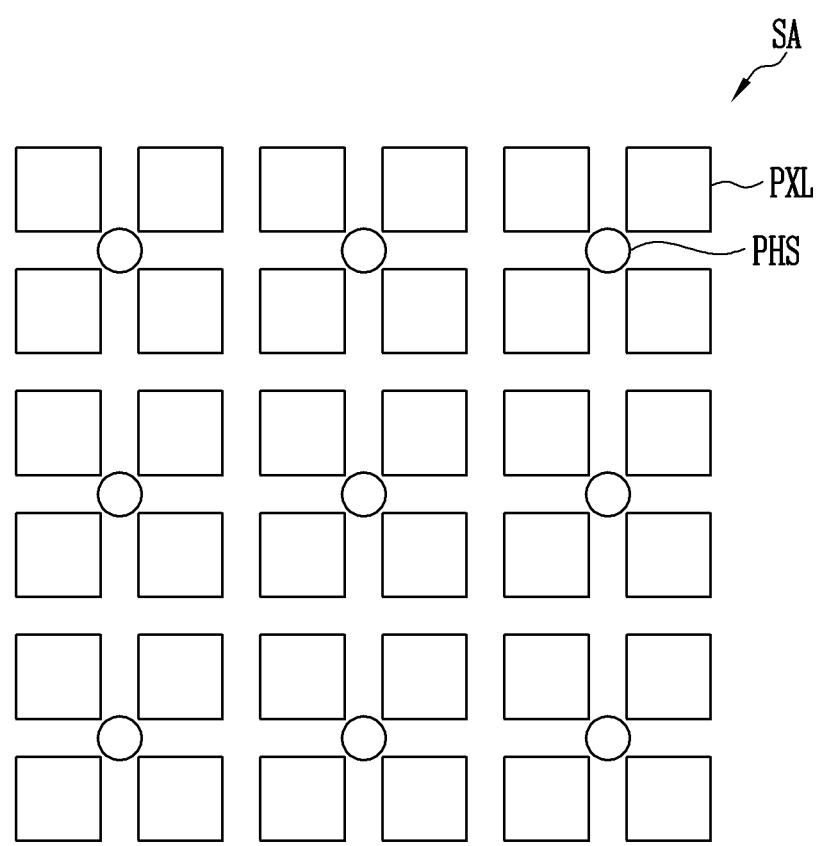

In such an embodiment, the light sensors PHS may have a size smaller than that of the pixels PXL as shown in FIGS. 3B and 3E, or may have a size larger than that of the pixels PXL as shown in FIGS. 3C and 3D.

When the light sensors PHS are disposed at the resolution lower than that of the pixels PXL, a part or all of the light sensors PHS may be disposed to overlap the pixels PXL. That is, the light sensors PHS may partially overlap with a part of the pixels PXL as shown in FIGS. 3B and 3C.

Alternatively, the light sensors PHS may be disposed between the pixels PXL and partially overlap the pixels PXL as shown in FIG. 3D. In such an embodiment, the light sensors PHS may have the size larger than that of the pixels PXL as shown in FIG. 3D. For example, the light sensors PHS may have a size to cover at least one pixel PXL.

Alternatively, the light sensors PHS may not overlap the pixels PXL as shown in FIG. 3E.

In various embodiments, the disposition structure between the pixels PXL and the light sensors PHS is not limited to the disposition structure described above. That is, a shape, an arrangement, a relative size, the number, a resolution, and the like of the pixels PXL and the light sensors PHS in the sensing area SA may be variously modified within the scope of the inventive concepts. In addition, in various embodiments, the pixels PXL and the light sensors PHS may be disposed in a form in which one or more of the embodiments of FIGS. 3A to 3E are combined.

In addition, FIGS. 3A to 3E show an example in which the light sensors PHS are regularly arranged in the sensing area SA, but the inventive concepts are not limited thereto, and in other embodiments, the light sensors PHS may be irregularly disposed in the sensing area SA.

The display panel 110 may include a first substrate SUB1, and a circuit element layer BPL, a light emitting element layer LDL, a first protective layer PTL1, a first adhesive layer ADL1, and a window WIN, which are sequentially disposed on one surface (for example, an upper surface) of the first substrate SUB1. In addition, the display device 10 may include a second adhesive layer ADL2 and a second protective layer PTL2 which are sequentially disposed on another surface (for example, a lower surface) of the first substrate SUB1.

The first substrate SUB1 may be a substantially transparent transmissive substrate as a base substrate of the display panel 110. The first substrate SUB1 may be a rigid substrate including glass or tempered glass, or a flexible substrate of a plastic material. However, the material of the first substrate SUB1 is not limited thereto, and the first substrate SUB1 may be configured of various materials.

The first substrate SUB1 may include the display area AA and the non-display area NA as shown in FIGS. 1 and 2. In addition, the display area AA may include a plurality of pixel areas PXA in which each pixel PXL is disposed and/or formed.

The circuit element layer BPL may be disposed on one surface of the first substrate SUB1 and include at least one conductive layer. For example, the circuit element layer BPL may include a plurality of circuit elements configuring a pixel circuit of the pixels PXL, and lines for supplying various power and signals for driving the pixels PXL. In this case, the circuit element layer BPL may include various circuit elements such as at least one transistor and a capacitor, and a plurality of conductive layers for configuring lines connected thereto. In addition, the circuit element layer BPL may include at least one insulating layer provided between the plurality of conductive layers. In addition, the circuit element layer BPL may include a wire portion disposed in the non-display area NDA of the first substrate SUB1 and supplies the power and signals corresponding to the lines connected to the pixels PXL.

The light emitting element layer LDL may be disposed on one surface of the circuit element layer BPL. The light emitting element layer LDL may include a plurality of light emitting elements LD connected to the circuit elements and/or the lines of the circuit element layer BPL through a contact hole or the like. In an embodiment, at least one of the plurality of light emitting elements LD may be disposed in each pixel area PXA.

Each of the pixels PXL may include the circuit elements disposed in the circuit element layer BPL and at least one light emitting element LD disposed in the light emitting element layer LDL above the circuit element layer BPL. A detailed description of a structure of the pixel PXL will be described later.

The first protective layer PTL1 may be disposed above the light emitting element layer LDL so as to cover the display area AA. The first protective layer PTL1 may include a sealing member such as a thin film encapsulation (TFE) or a sealing substrate, and may further include a protective film or the like in addition to the sealing member.

The first adhesive layer ADL1 is disposed between the first protective layer PTL1 and the window WIN to couple the first protective layer PTL1 and the window WIN. The first adhesive layer ADL1 may include a transparent adhesive such as an optical clear adhesive (OCA), and may include various adhesive materials.

The window WIN is a protective member disposed at the uppermost end of the module of the display device 10 including the display panel 110, and may be a substantially transparent transmissive substrate. The window WIN may have a multilayer structure selected from a glass substrate, a plastic film, and a plastic substrate. The window WIN may include a rigid or flexible substrate, and a configuration material of the window WIN is not particularly limited.

In various embodiments, the display device 10 may further include a polarization plate, a touch sensor layer (touch electrode layer), and/or the like which are/is not shown. For example, the display device 10 may further include a polarization plate and/or a touch sensor layer disposed between the first protective layer PTL1 and the window WIN.

The second protective layer PTL2 may be disposed on the other surface of the first substrate SUB1. The second protective layer PTL2 may be coupled to the first substrate SUB1 by the second adhesive layer ADL2.

The second adhesive layer ADL2 may firmly bond (or attach) the first substrate SUB1 and the second protective layer PTL2. The second adhesive layer ADL2 may include a transparent adhesive such as an OCA. The second adhesive layer ADL2 may include a pressure sensitive adhesive (PSA) in which an adhesive material acts when a pressure for adhesion to an adhesive surface is applied. When the second adhesive layer ADL2 includes a PSA, the second adhesive layer ADL2 may be adhered to the adhesive surface only by pressure without an additional heat process or UV process at room temperature.

In an exemplary embodiment, the second adhesive layer ADL2 may include a material that absorbs specific light or may include a material that blocks the specific light. For example, the second adhesive layer ADL2 may include an infrared light absorbing material that absorbs infrared light having a high energy density, or may include an infrared light blocking material that blocks the infrared light.

The infrared light absorbing material may include, for example, an inorganic based oxide including antimony-tin oxide (ATO), indium tin oxide (ITO), tungsten oxide, carbon black, and the like, and a metal such as Ag. In a case of the inorganic based oxide, the infrared light absorbing material may selectively transmit light of a visible light region and absorb the infrared light. In addition, the infrared light absorbing material may include, for example, an organic based dye. The organic based dye may be, for example, a dye used in a color filter (not shown) included in the display panel 110.

For example, the infrared light blocking material may be at least one selected from a borate mixture, a carbonate mixture, an alumina mixture, a nitrate mixture, a nitrite mixture, lithium borate and sodium borate, potassium borate, magnesium borate, calcium borate, strontium borate, barium borate, sodium borate, $Na_2B4O_X$, colemanite, lithium carbonate, sodium carbonate, potassium carbonate, calcium carbonate, calcite, $CaCO_3$, dolomite, and magnesite. In addition, the infrared light blocking material may be at least one selected from one group selected from a nickel dithiol system, a dithiol based metal complex compound, a cyanine system, a squarium system, a croconium system, a diimonium system, an aminium system, an ammonium system, a phthalocyanine system, a naphthalocyanine system and naphthalocyanine system, aminium system, anthraquinone system, a naphthoquinone system, a polymer condensation azo based pyrrole, a polymethine system, and a propylene system.

When the finger of the user is placed (or positioned) on a display surface (for example, one surface on which an image is displayed) of the display device 10, the display device 10 may perform a function of sensing the fingerprint of the user through the light sensor PHS that will be described later. When external light is input to the display device 10 while the fingerprint of the user is sensed, the visible light region of the external light is blocked by a hand of the user, but the infrared light may be transmitted through the hand of the user and may be incident on the light sensors PHS. The infrared light incident on the light sensors PHS act as noise, thereby reducing recognition accuracy of light reflected by the hand of the user.

When the second adhesive layer ADL2 includes the infrared light absorbing material and/or the infrared light blocking material as in the above-described embodiment, even though the infrared light of the external light transmits the hand of the user, the infrared light is absorbed and/or blocked by the second adhesive layer ADL2, and thus the infrared light is not incident on the light sensors PHS. Therefore, fingerprint recognition accuracy may be improved.

The second protective layer PTL2 may block inflow of oxygen, moisture, and the like from the outside and may be provided in a form of a single layer or a multilayer. The second protective layer PTL2 may be configured in a film form to further secure flexibility of the display panel 110. The second protective layer PTL2 may be coupled to the sensor layer PSL through another adhesive layer (not shown) including a transparent adhesive such as an OCA.

In various embodiments, a selective light blocking film may be further provided under the second protective layer PTL2. The selective light blocking film may prevent the light from entering into the light sensors PHS of the sensor layer PSL by blocking a specific frequency region, for example, infrared light, of the external light introduced into the display device 10. In the above description, the selective light blocking film is further provided under the second protective layer PTL2, but the inventive concepts are not limited thereto. That is, in another embodiment, the selective light blocking film may be provided on any layer of the display device 10 when the selective light blocking film is disposed above the sensor layer PSL. In addition, the selective light blocking film may be omitted when an infrared light blocking component is included in the display panel 110.

Figure 4A:
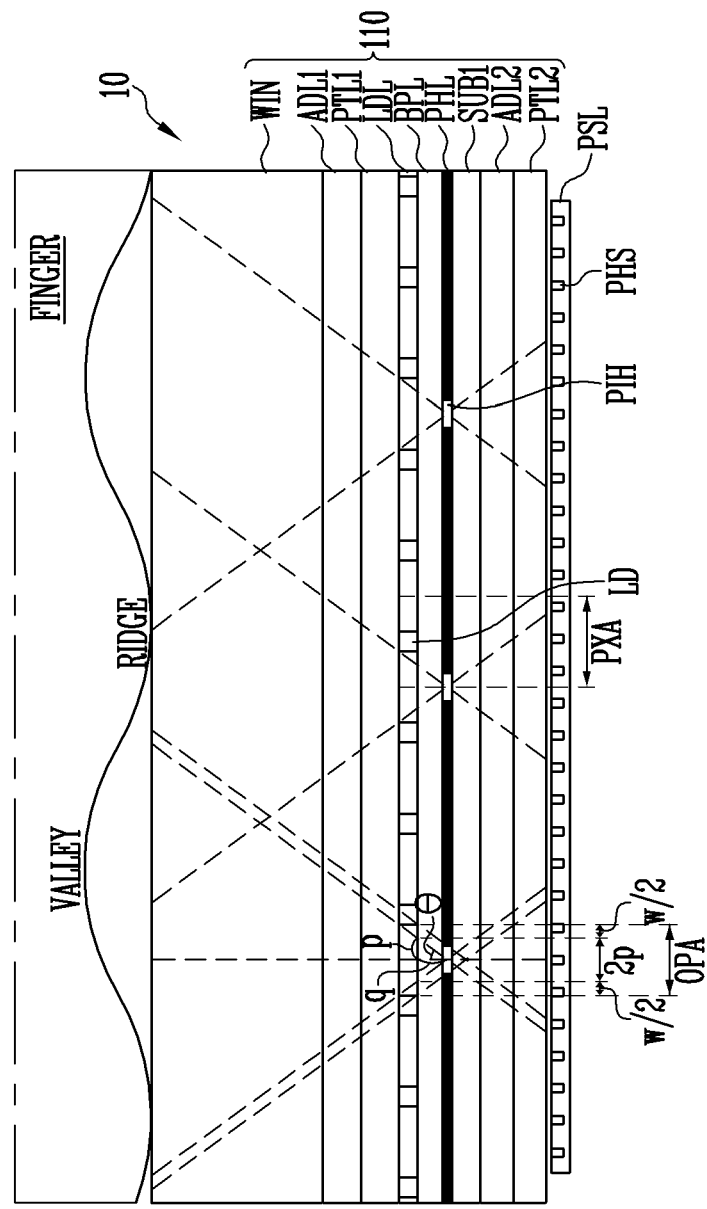
FIG. 4A is a cross-sectional view of a display device according to an exemplary embodiment of the inventive concepts.

A light blocking layer PHL may be disposed between the light emitting element layer LDL and a sensor layer PSL that will be described later. For example, the light blocking layer PHL may be disposed between the first substrate SUB1 and the circuit element layer BPL as shown in FIG. 4A. The light blocking layer PHL may include a plurality of pinholes PIE as described with reference to FIG. 2.

The display panel 110 may be formed to be transparent in an area where pinhole PIH is disposed so that the reflected light reflected from a fingerprint area or the like of the finger may transmit through each pinhole PIH. In addition, in order to reduce loss of the reflected light necessary for fingerprint sensing, the display panel 110 may be configured so that light that satisfies an observation view (a field of view (FOV), or referred to as a "viewing angle") of a predetermined angle range transmits each pinhole PIE.

For example, the display panel 110 may be formed to be transparent in an area having an area greater than that of the pinhole PIH and overlapping the pinhole PIH centered on an area where each pinhole PIH is disposed. Hereinafter, an area formed to be transparent so that the reflected light may transmit is referred to as an optical opening area OPA.

Based on a center of each pin hole PIH, when a field of view angle of a desired range is θ, a thickness of circuit element layer BPL is q, and a width of the optical opening area OPA formed at a boundary surface of the circuit element layer BPL and the light emitting element layer LDL is 2p, "$2p=2\times(q\times\tan\theta)$" may be satisfied. In an embodiment, the field of view may be an angle of a range from about 30 degrees to 60 degrees, for example, 45 degrees, but is not limited thereto.

The pinholes PIH may have a width w in a range of a predetermined width w, for example, 5 μm to 20 μm, and a width of the optical opening area OPA considering this may be 2p+w. In this manner, the width of the optical opening area OPA to be secured in each layer of the display device 10 may be gradually increased as a distance from the light blocking layer PHL is increased (that is, as each of distances from an upper portion and a lower portion of the light blocking layer PHL is increased).

The width w (or diameter) of the pinholes PIH may be set to about 10 times or more, for example, about 4 μm or 5 μm or more of a wavelength of the reflected light so as to prevent or reduce diffraction of light. In addition, the width w of the pinholes PIH may be set to a size enough to prevent or reduce image blur and to more clearly sense a shape of the fingerprint. For example, the width w of the pinholes PIH may be set to about 20 μm or less. However, the inventive concepts are not limited thereto, and the width w of the pinholes PIH may be changed according to a wavelength band of the reflected light and/or thicknesses of each layer of the module.

A distance (or pitch) between adjacent pinholes PIH may be set in consideration of a distance between the light blocking layer PHL and the sensor layer PSL and a wavelength range of the reflected light. For example, when the field of view of the reflected light to be secured is about 45 degrees, the distance between the adjacent pinholes PIH may be set to twice or more the distance between the light blocking layer PHL and the sensor layer PSL, and may be set to a value equal to or greater than a value obtained by adding a predetermined error range to the distance. In this case, the images observed by the respective light sensors PHS may be prevented from overlapping with each other, thereby preventing or reducing image blur.

The sensor layer PSL is attached to a rear surface (for example, a back surface) of the display panel 110 so as to overlap at least one area of the display panel 110. The sensor layer PSL may be disposed so as to overlap the display panel 110 in at least the display area AA. The sensor layer PSL may include a plurality of light sensors PHS distributed at a predetermined resolution and/or distance. The distance between the light sensors PHS may be set tightly so that the reflected light reflected from an object to be observed (for example, a specific area of the finger such as a fingerprint area) may be incident on at least two adjacent light sensors PHS.

The light sensors PHS of the sensor layer PSL may output an electrical signal corresponding to the reflected light received through the pinholes PIH as the sensing signal. The reflected light received by each light sensor PHS may have different optical characteristics (for example, frequency, wavelength, size, and the like) according to whether the reflected light is due to a valley of the fingerprint formed on the finger of the user or due to a ridge. Therefore, each of the light sensors PHS may output a sensing signal having different electrical characteristics corresponding to the optical characteristics of the reflected light. The sensing signal output by the light sensors PHS may be converted into image data and used for fingerprint identification of the user.

As described above, the display device 10 according to the inventive concepts includes the fingerprint sensor including the light emitting element layer LDL, the sensor layer PSL, and the light blocking layer PHL. The light emitting element layer LDL may include the light emitting elements LD that may also function as a light source of a sensor using the light sensing method. The sensor layer PSL may include the light sensors PHS that receive light emitted from the light emitting element layer LDL and reflected from an object (for example, the fingerprint area of the finger) positioned above the display device 10. The light blocking layer PHL may include the pinholes PIH disposed between the light emitting element layer LDL and the sensor layer PSL to selectively transmit the reflected light.

According to an embodiment, the fingerprint sensor may further include the optical opening area OPA formed inside the display panel 110 or the like in order to reduce the loss of the reflected light incident on each pinhole PIH within a predetermined field of view angle range. In addition, the fingerprint sensor may include a light control layer disposed inside the display panel 110 to control a light path so as to more easily control the field of view. Various embodiments of the light control layer will be described below with reference to FIGS. 9 to 12C.

Meanwhile, the display device 10 also utilizes the light emitting elements LD of the pixels PXL as the light source of the fingerprint sensor, but the inventive concepts are not limited thereto. For example, a display device according to another embodiment may have a separate light source for the fingerprint sensing.

A fingerprint sensing method of the display device 10 according to the above-described embodiment will be briefly described as follows. During a fingerprint sense period during which the light sensors PHS are activated, in a state in which the finger (for example, the fingerprint area) of the user is in contact or close to the display area AA, the pixels PXL (particularly, the light emitting elements LD included in the pixels PXL) of the display area AA may be emitted. For example, during the fingerprint sensing period, all of the pixels PXL of the display area AA may be simultaneously or sequentially emitted. Alternatively, only some pixels PXL may be emitted at predetermined intervals among the pixels PXL of the display area AA or only some pixels PXL that emit light of a specific color (for example, light having a short wavelength such as blue light) may be selectively emitted.

Some of light emitted from the pixels PXL may be reflected by the finger of the user, and may be incident on the light sensors PHS through the optical opening area OPA and the pinholes PIH of the display device 10. At this time, a fingerprint shape (fingerprint pattern) of the user may be detected based on a light amount difference and/or a waveform of the reflected light reflected from ridges and valleys of each fingerprint.

Figure 4B:
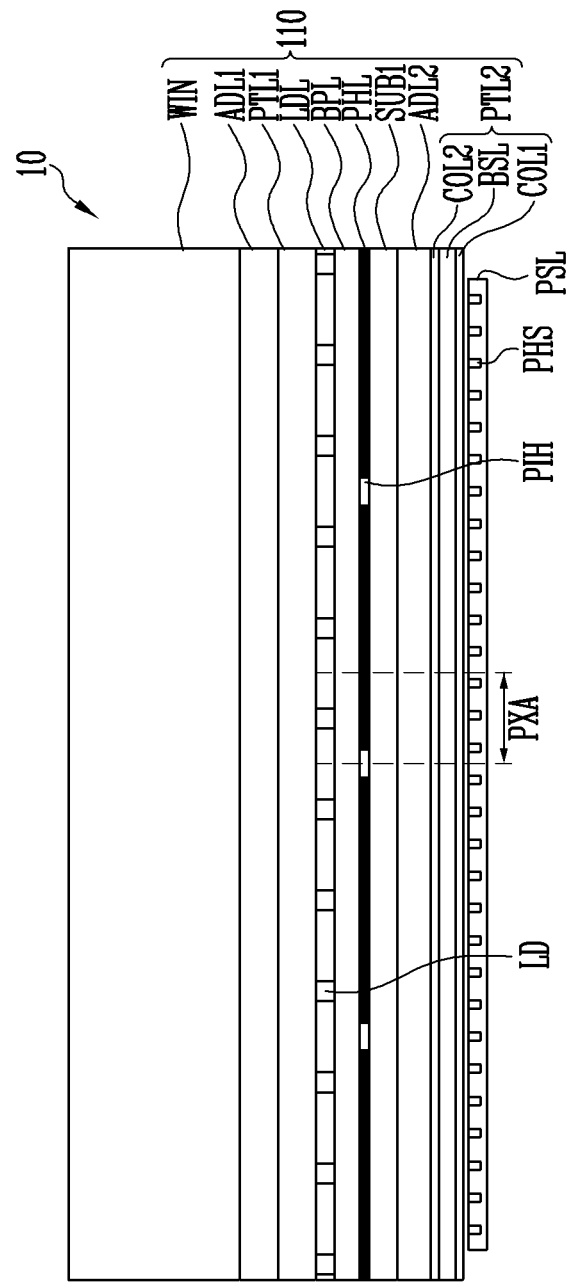
FIG. 4B is a cross-sectional view of a display device according to another embodiment of the inventive concepts.

FIG. 4B is a cross-sectional view of a display device according to another embodiment. In FIG. 4B, the detailed description of the same or similar configuration as in the embodiment of FIG. 4A described above will be omitted.

Referring to FIG. 4B, the display panel 110 includes a second protective layer PTL2. The second protective layer PTL2 may include a base layer BSL, and a first coating layer COL1 and a second coating layer COL2 formed on a lower surface and an upper surface of the base layer BSL, respectively.

The base layer BSL may be formed in a plastic film form including at least one organic film. For example, the plastic film may be manufactured by including at least one of thermoplastic polymer resin such as polycarbonate (PC), polyimide (PI), polyethersulfone (PES), polyarylate (PAR), polyethylene naphthalate (PEN), polyethylene terephthalate (PET), cycloolefin copolymer, epoxy, thermosetting polymer resin such as unsaturated polyester, phenol (PF), silicone, polyurethane, and the like.

In an exemplary embodiment, the material of the base layer BSL is not limited to those described above, and the material of the base layer BSL may be selected as a suitable material according to a design condition or the like of the display panel 110 among materials capable of protecting the layers disposed thereon. According to an embodiment, the base layer BSL may also include the same material as the infrared light absorbing material and/or the infrared light blocking material included in the second adhesive layer ADL2 of the display device 10.

Any one of the first and second coating layers COL1 and COL2 may be coated with an infrared light reflecting and blocking material and the other may be coated with an infrared light absorbing material. For example, the first coating layer COL1 may be a layer on which a mixture in which the infrared light absorbing material is mixed is applied (or coated), and the second coating layer COL2 may be a layer on which a mixture in which the infrared light reflecting and blocking material is mixed is applied (or coated). Examples of the infrared light reflecting and blocking material may include titanium oxide ($TiO_2$), magnesium fluoride ($MgF_2$), and the like, but the inventive concepts are not limited thereto.

As described above, when the second protective layer PTL2 includes the infrared light reflecting and/or blocking material and the infrared light absorbing material, even though the infrared light of the external light transmits through the hand of the user, the infrared light is not incident on the sensor layer PSL by the second protective layer PTL2 positioned above the sensor layer PSL. Therefore, the light sensors PHS may more accurately recognize the fingerprint of the user without interference of the external light.

According to an exemplary embodiment, the infrared light may be blocked by configuring some configurations of the display panel 110, for example, the second adhesive layer ADL2 and/or the second protective layer PTL2 to include the infrared light absorbing material and/or the infrared light blocking material, without addition of a separate component such as an infrared light blocking film. Therefore, a manufacturing cost of the display device 10 may be reduced and the thickness of the display device 10 may be further reduced.

Hereinafter, the above-described light blocking layer PHL will be described in more detail.

Figure 5:
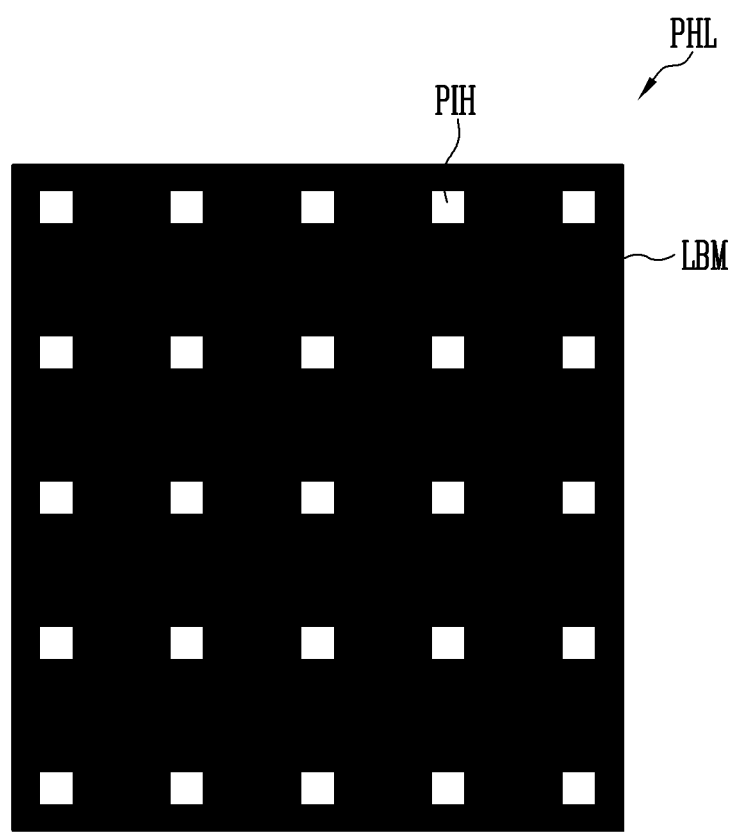
FIG. 5 is a plan view illustrating a light blocking layer according to an exemplary embodiment of the inventive concepts.

FIG. 5 is a plan view illustrating a light blocking layer according to an exemplary embodiment.

Referring to FIG. 5, the light blocking layer PHL may include a light blocking mask LBM and a plurality of pinholes PIH distributed in the light blocking mask LBM.

The light blocking mask LBM may be configured of a light blocking and/or a light absorbing material. For example, the light blocking mask LBM may be configured of an opaque metal layer (conductive layer) that is locally opened in an area where each pinhole PIH is disposed. However, the configuration material of the light blocking mask LBM is not limited to metal, and the light blocking mask LBM may be configured of various materials capable of blocking light transmission. For example, the light blocking mask LBM may be configured of the currently known black matrix material.

The pinholes PIH may be opening portions dispersed in the light blocking mask LBM. The pinholes PIH may be dispersed in the light blocking mask LBM in a regular or irregular pattern so as to have certain size and distance.

In the embodiment of FIG. 5, the pinholes PIH are shown as rectangles, but the inventive concepts are not limited thereto. That is, in various embodiments, the pinholes PIH may have various shapes such as rectangles, circles, ellipses, polygons, and the like. However, the inventive concepts are not limited thereto, and the size, shape, number, resolution, arrangement structure, and/or the like of the pinholes PIH may be variously changed.

The light blocking layer PHL may be disposed between the light emitting element layer LDL in which the light emitting elements LD are disposed and the sensor layer PSL in which the light sensors PHS are disposed in the display device 10 in FIGS. 1 to 4B. The light blocking layer PHL may configure an optical system for selectively transmitting only some of light and blocking the remaining light.

The light blocking layer PHL may configure the fingerprint sensor together with the above-described light sensors PHS. In addition, the light blocking layer PHL may be formed integrally with the circuit element layer BPL of the display panel 110. In this case, the module thickness of the fingerprint sensor using the light sensing method and the display device including the fingerprint sensor may be reduced or minimized.

FIGS. 6A to 6D are plan views illustrating various embodiments of a disposition structure of pixels, pinholes, and light sensors. Specifically, FIGS. 6A to 6D illustrate different embodiments related to relative sizes, resolutions, and/or disposition relationships of the pixels PXL, the pinholes PIH, and the light sensors PHS disposed in the sensing area SA of FIGS. 1 to 4B.

Figure 6A:
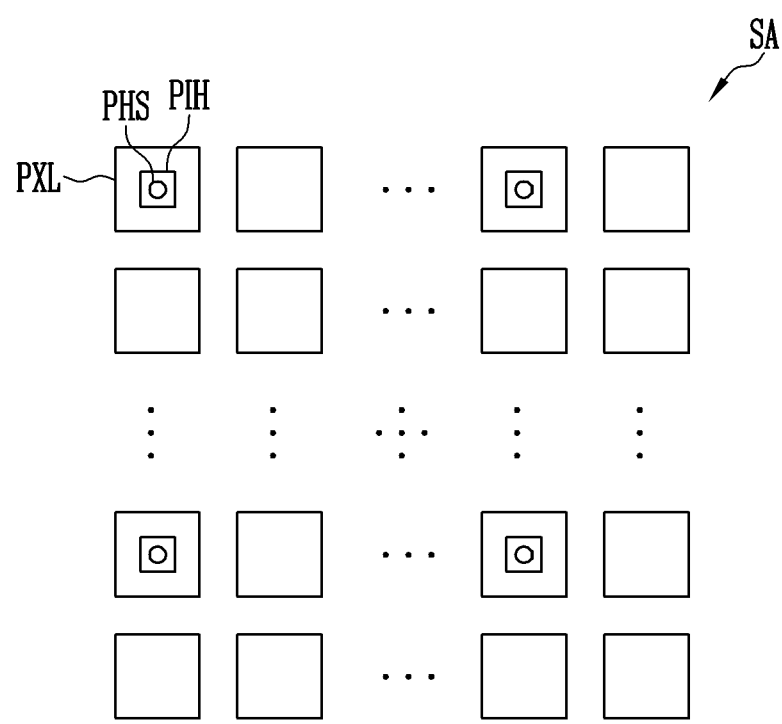
FIGS. 6A, 6B, 6C, and 6D are plan views illustrating various embodiments of a disposition structure of pixels, pinholes, and light sensors.

Referring to FIG. 6A, the sensing area SA may include the pinholes PIE and light sensors PHS of the number smaller than that of the pixels PXL. For example, the pinholes PIE and the light sensors PHS may have a size smaller than that of the pixels PXL and may be distributed in the sensing area SA with a resolution lower than that of the pixels PXL.

On the other hand, although FIG. 6A shows an embodiment in which the numbers of the pinholes PIH and the light sensors PHS are less than that of the number of the pixels PXL, the inventive concepts are not limited thereto. That is, in another embodiment, the pinholes PIH and the light sensors PHS may be distributed in the sensing area SA at substantially the same number and distance so that the pinholes PIE and the light sensors PHS may correspond with each other one to one basis. For example, the pinholes PIE and the light sensors PHS may be disposed so as to overlap with each other in pairs with one to one basis. According to an embodiment, the pair of pinholes PIE and light sensor PHS may be disposed so as to overlap any one of the pixels PXL disposed in the sensing area SA, but the inventive concepts are not limited thereto. For example, the pinholes PIE and the light sensors PHS may be alternately disposed so as not to overlap with each other, or may be disposed so as not to overlap the pixels PXL.

The pinholes PIH and the light sensors PHS may have the same or different sizes. That is, the relative sizes and resolutions of the pinholes PIH and the light sensors PHS are not particularly limited.

Figure 6B:
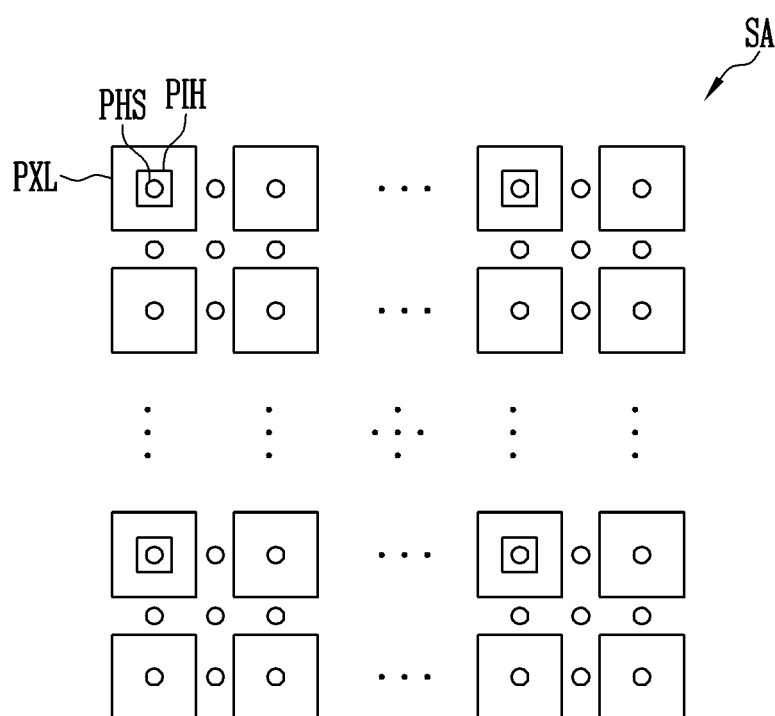

Referring to FIG. 6B, the sensing area SA may include the pinholes PIH of the number smaller than that of the pixels PXL and the light sensors PHS of the number larger than that of the pixels PXL. For example, the pinholes PIH and the light sensors PHS may have a size smaller than that of the pixels PXL, the pinholes PIH may be distributed in the sensing area SA with a resolution lower than that of the pixels PXL, and the light sensors PHS may be densely distributed in the sensing area SA with a resolution higher than that of the pixels PXL.

At least a part of the light sensors PHS may overlap any one of the pinholes PIH and/or the pixels PXL, but is not limited thereto. For example, a part of the light sensors PHS may be disposed so as to overlap the pinholes PIH and/or the pixels PXL, and others may be disposed in a gap between the pixels PXL.

Figure 6C:
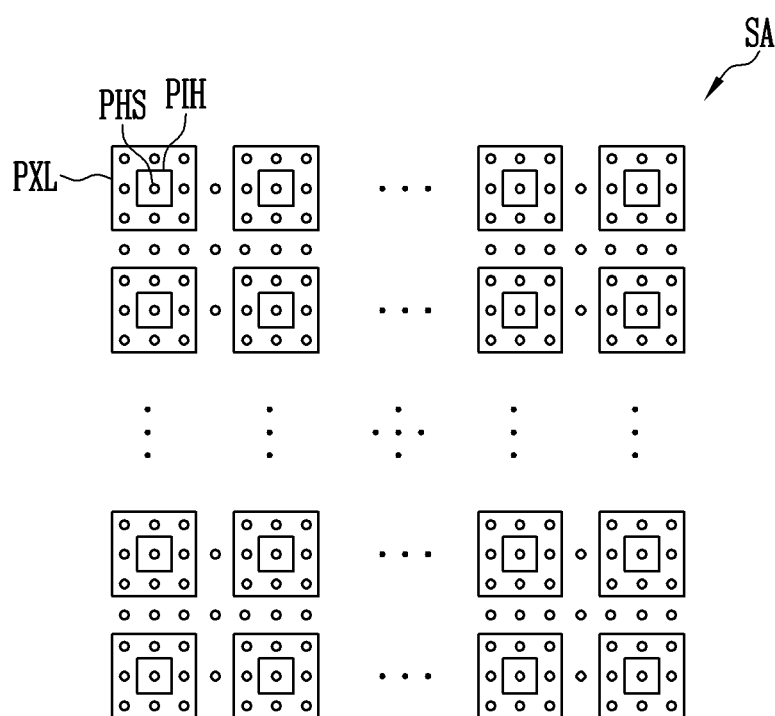
Figure 6D:
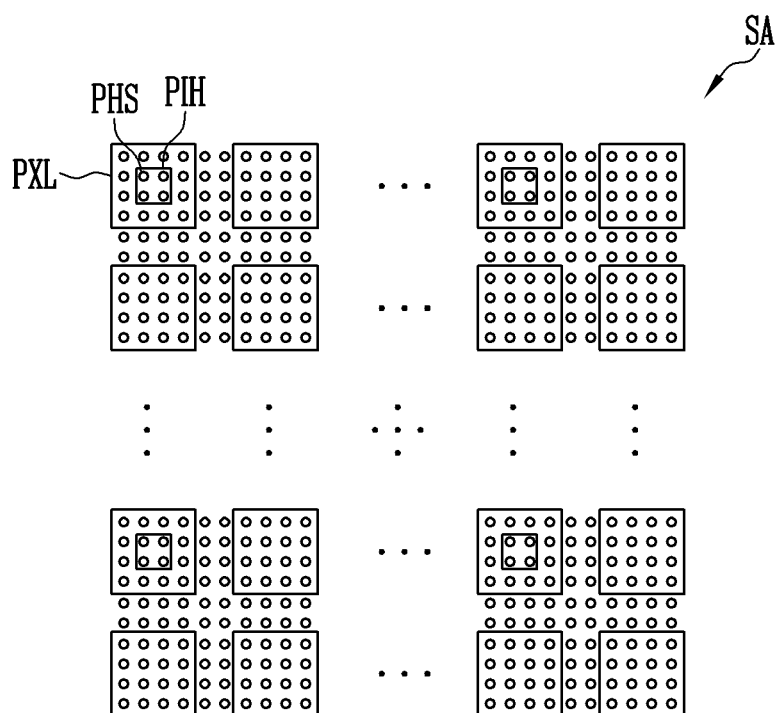

Referring to FIGS. 6C and 6D, the light sensors PHS may be distributed in the sensing area SA to have a smaller size and a higher resolution than those of the embodiment shown in FIG. 6B. For example, a plurality of light sensors PHS may overlap each of the pinhole PIH and/or the pixel PXL. On the other hand, the pinholes PIH may be distributed in the sensing area SA with the resolution same as or different from that of the pixels PXL. For example, the pinholes PIH may be distributed in the sensing area SA with the same resolution as the pixels PXL as shown in FIG. 6C, or may be distributed in the sensing area SA with a resolution lower than that of the pixels PXL as shown in FIG. 6D.

FIGS. 6A to 6D show an embodiment in which the pinholes PIH and the light sensors PHS are arranged in a regular array form in the sensing area SA, but the inventive concepts are not limited thereto. That is, the pinholes PIH and/or the light sensors PHS may be irregularly scattered in the sensing area SA, or may be distributed in different densities or arrangement structures according to each area or section of the sensing area SA.

The disposition structure of the pixels PXL, the pinholes PIH, and the light sensors PHS is not limited to the embodiments shown in FIGS. 6A to 6D. For example, the shape, arrangement type, relative size, number, resolution, mutual disposition relationship, and/or the like of the pixels PXL, the pinholes PIH, and/or the light sensors PHS may be variously changed.

FIGS. 7, 8, 9, 10, 11, 12A, 12b, and 12C are cross-sectional views of a display device according to other embodiments. In FIGS. 7 to 12C, the detailed description of the same or similar configuration as at least one embodiment described above will be omitted in the description with reference to FIGS. 7 to 12C.

Referring to FIG. 7, the display panel 110 may further include a second substrate SUB2 disposed on one surface (for example, a lower surface) of the first substrate SUB1. The second substrate SUB2 may be disposed between the first substrate SUB1 and the sensor layer PSL. In such an embodiment, a barrier layer BRL may be disposed between the first substrate SUB1 and the second substrate SUB2.

The second substrate SUB2 may be configured of a material the same as or different from that of the first substrate SUB1. For example, both of the first substrate SUB1 and the second substrate SUB2 may be a thin film substrate of polyimide (PI) material. Alternatively, the first substrate SUB1 and the second substrate SUB2 may be a heterogeneous substrate including materials different from each other. The second substrate SUB2 may include at least one material previously referred to as the configuration material of the first substrate SUB1, and may be configured of other various materials.

The barrier layer BRL may be provided in a form of a single layer or a multilayer. For example, the barrier layer BRL may be formed of a structure in which at least ten or more inorganic insulating layers are stacked.

Figure 8:
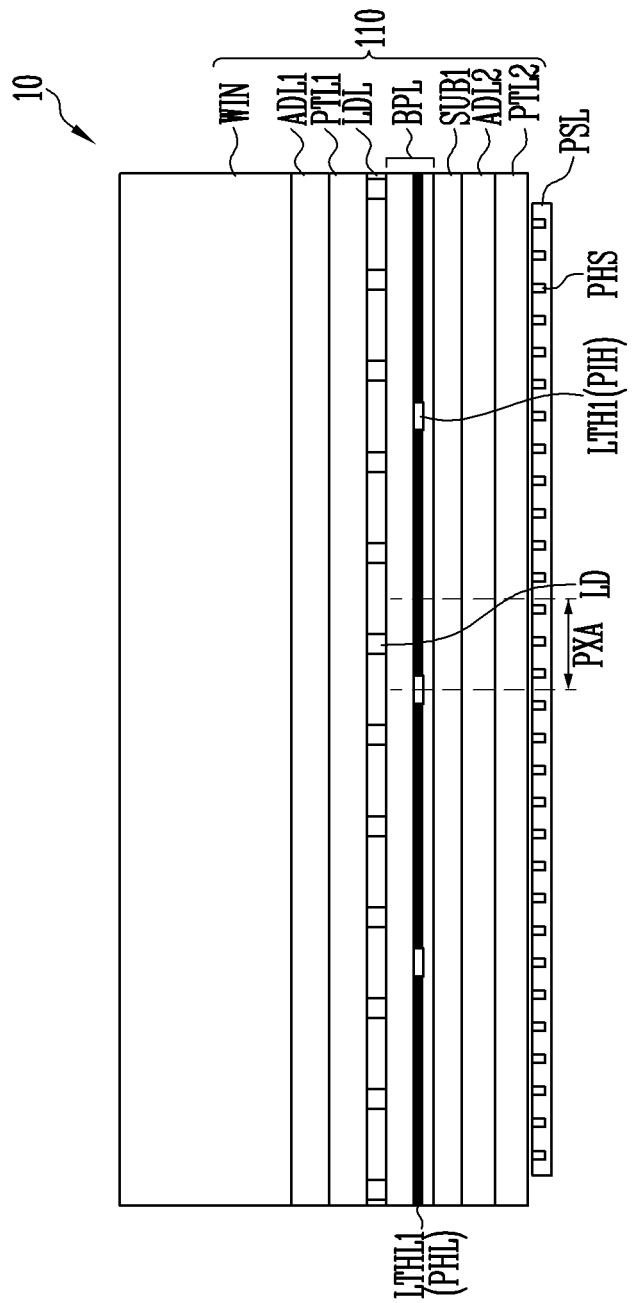

Referring to FIG. 8, the circuit element layer BPL may include a first opening array layer LTHL1 disposed in the sensing area SA. For example, the first opening array layer LTHL1 may include a plurality of first openings LTH1 distributed in the circuit element layer BPL. In such an embodiment, the first opening array layer LTHL1 may be provided instead of the light blocking layer PHL. That is, the first openings LTH1 may function as the pinholes PIH, respectively.

When the pinhole PIH is configured by using the plurality of first openings LTH1 (or first opening portions) distributed in the circuit element layer BPL without separately providing the light blocking layer PHL as shown in FIG. 8, a separate mask process for forming the light blocking layer PHL may be omitted. In addition, the display device 10 according to the embodiment shown in FIG. 8 may prevent a thickness increase due to the separate provision of the light blocking layer PHL, reduce a manufacturing cost, and increase process efficiency.

In addition, when the pinhole PIH is provided in the circuit element layer BPL as shown in FIG. 8, since a distance between the pinholes PIE and the optical opening area OPA described with reference to FIG. 4A is reduced, a width of the optical opening area OPA may be reduced. Then, since a size of the pixel area PXA may be reduced, the display device 10 of high resolution may be realized.

Figure 9:
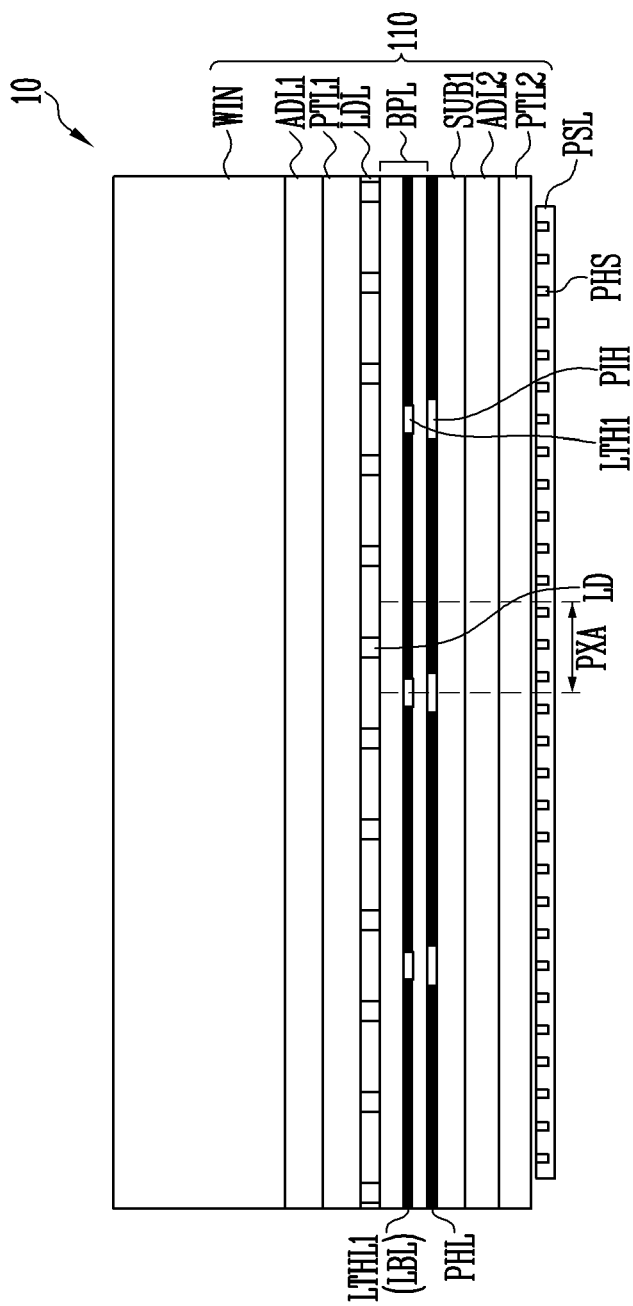
Figure 10:
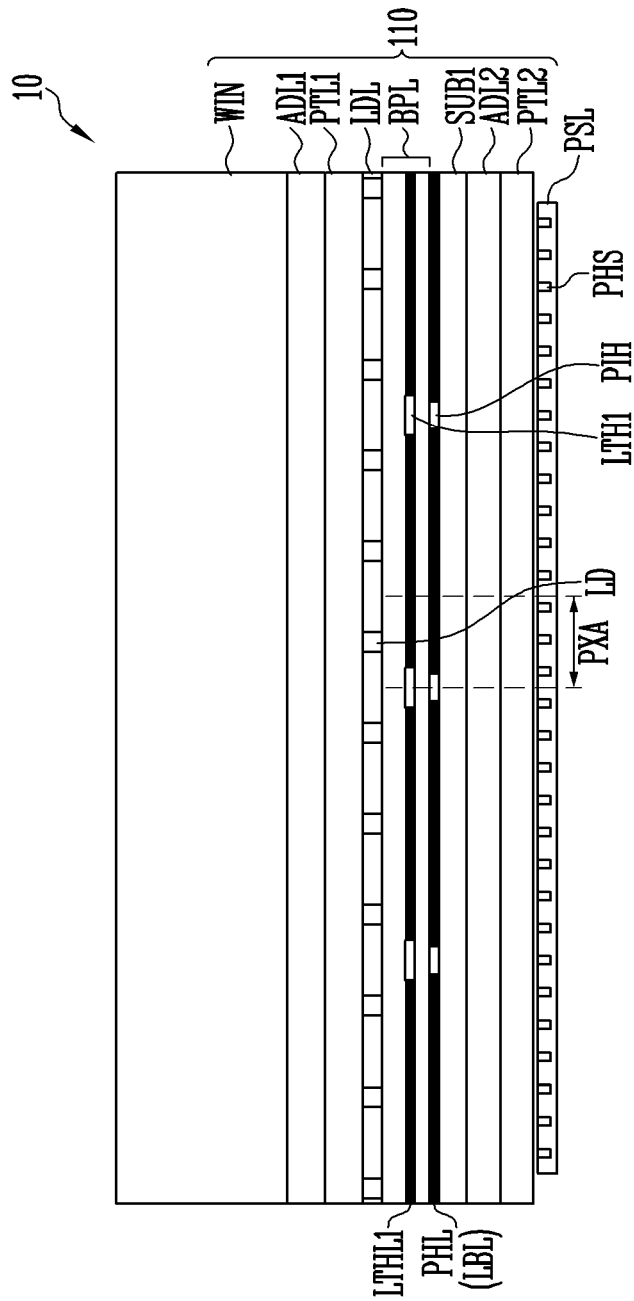

Referring to FIGS. 9 and 10, the circuit element layer BPL may include the first opening array layer LTHL1 including the plurality of first openings LTH1. In addition, the light blocking layer PHL including the plurality of pinholes PIE may be disposed between the first substrate SUB1 and the circuit element layer BPL. Each first opening LTH1 and each pinhole PIE are disposed so that at least portions thereof overlap.

In various embodiments, the first openings LTH1 and the pinholes PIE may have the same or different sizes. For example, the first openings LTH1 may have a width (or diameter) smaller than that of the pinholes PIE, as shown in FIG. 9. For example, the pinholes PIE and the first openings LTH1 may have a width (or diameter) of a range of 4 μm to 20 μm, and the width (or diameter) of the first opening LTH1 may be smaller than that of the pinholes PIH.

In an embodiment, when the first opening LTH1 has a polygonal shape, the width of the first opening LTH1 in any second direction different from the width of the first opening LTH1 in any first direction may be the same or different from each other.

In the embodiment in which the first openings LTH1 have a size smaller than that of the pinholes PIH, the first opening array layer LTHL1 may performs a function of the light control layer LBL controlling the path of the light (for example, limiting the field of view of the reflected light to a predetermined angle range), and the light blocking layer PHL may perform a light blocking function.

The first openings LTH1 may have a width (or diameter) larger than that of the pinholes PIH as shown in FIG. 10. In such an embodiment, the first opening array layer LTHL1 may perform a light blocking function and the light blocking layer PHL may perform the function of the light control layer LBL controlling the path of the light.

Figure 11:
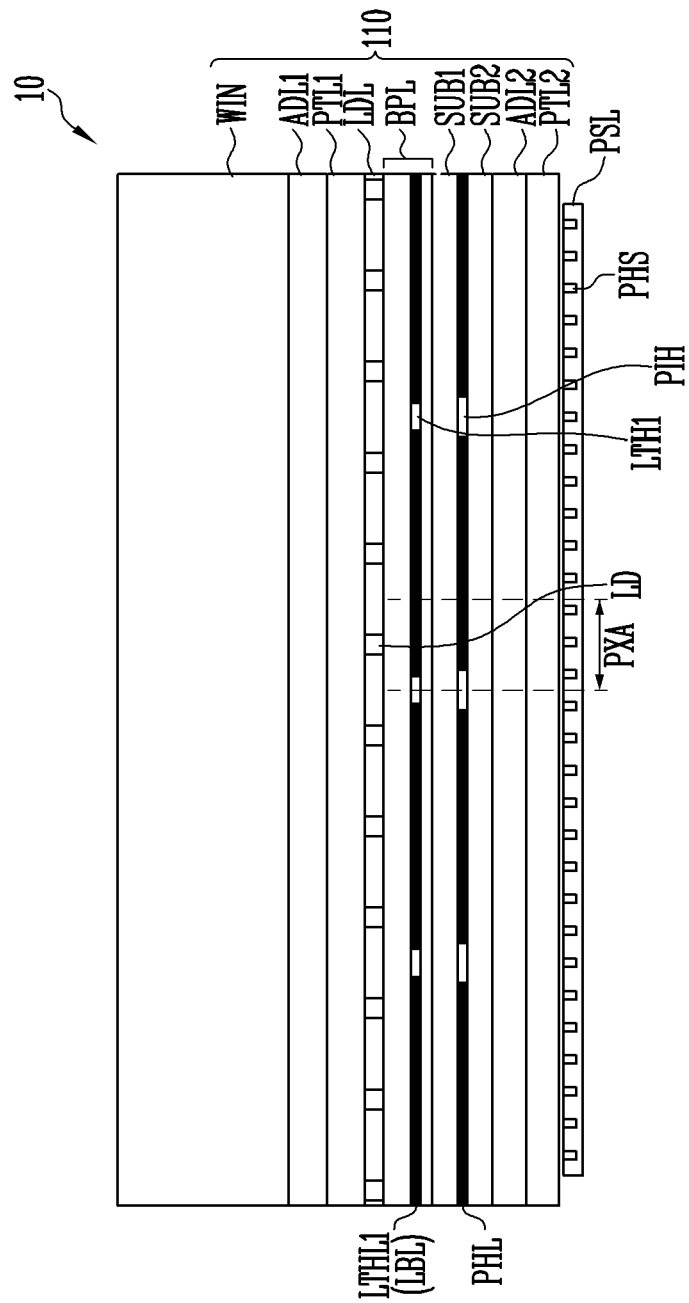

Referring to FIG. 11, the circuit element layer BPL may include the first opening array layer LTHL1 including the plurality of first openings LTH1. In addition, the light blocking layer PHL including the plurality of pinholes PIH may be disposed between the first substrate SUB1 and the circuit element layer BPL. Each first opening LTH1 and each pinhole PIH are disposed so that at least portions thereof overlap.

In various embodiments, the first openings LTH1 and the pinholes PIH may have the same or different sizes. For example, the first openings LTH1 may have a width (or diameter) smaller than that of the pinholes PIH. In such an embodiment, the first opening array layer LTHL1 may perform the function of the light control layer LBL controlling the path of the light, and the light blocking layer PHL may perform the light blocking function.

Figure 12A:
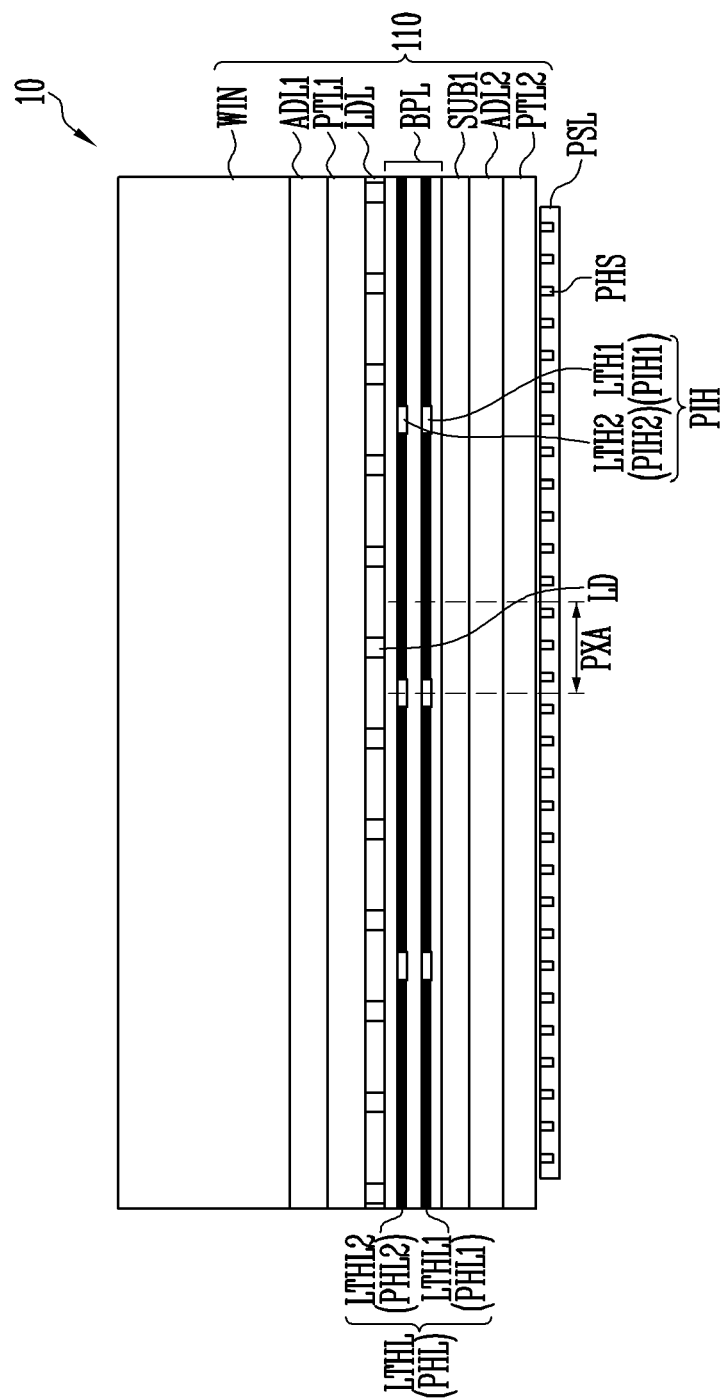
Figure 12B:
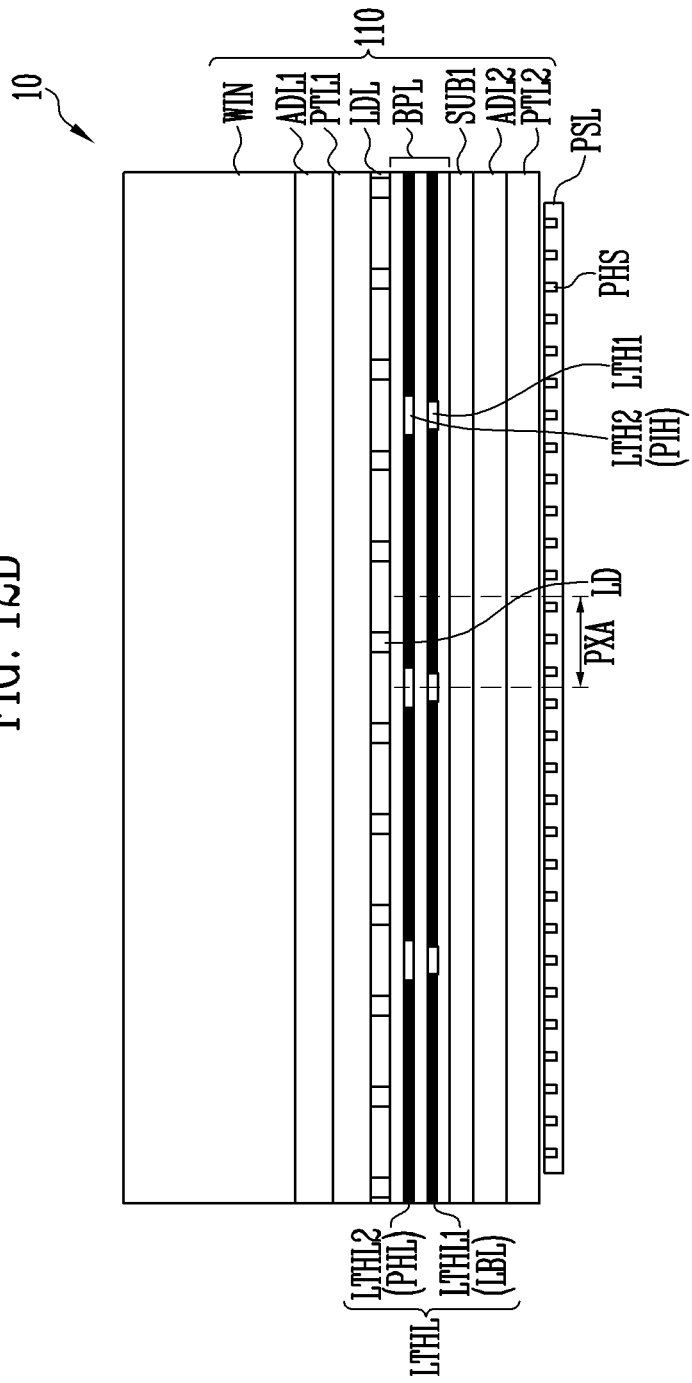
Figure 12C:
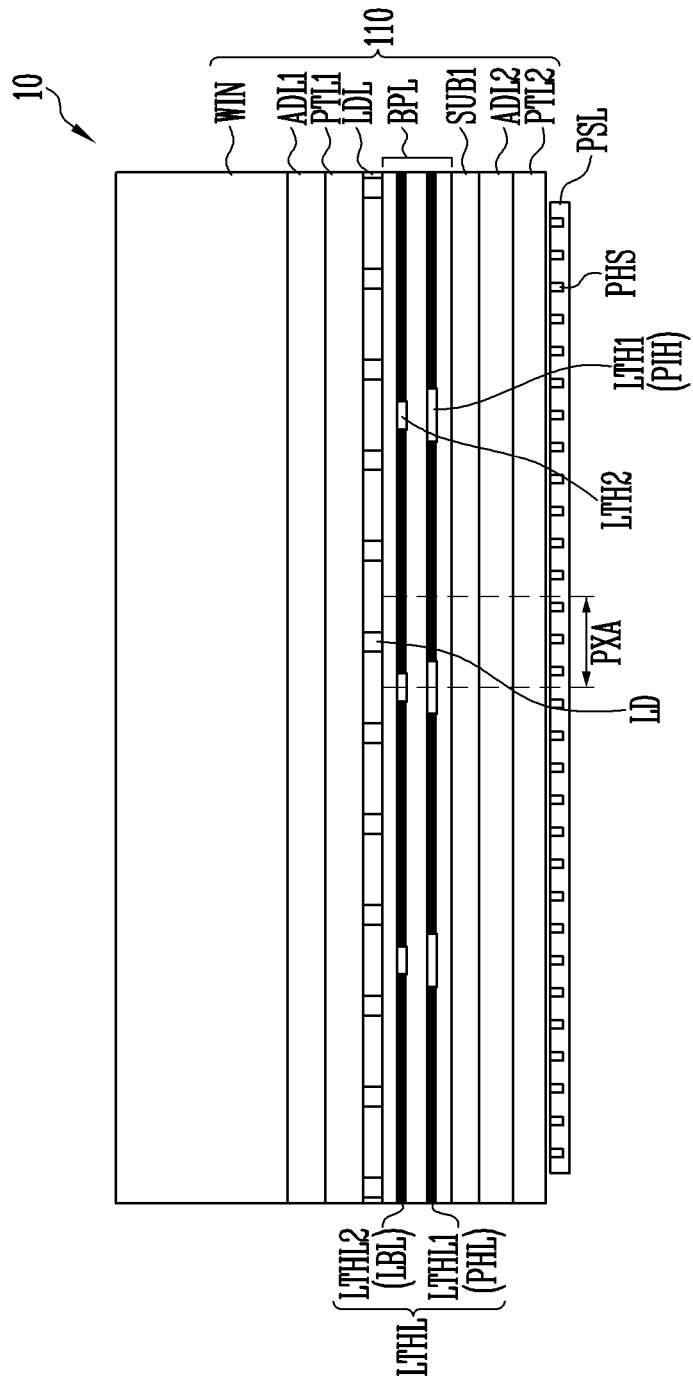

Referring to FIGS. 12A to 12C, the circuit element layer BPL may include a light opening array layer LTHL disposed in the sensing area SA. The opening array layer LTHL may be formed of a multilayer. For example, the opening array layer LTHL includes a first opening array layer LTHL1 including first openings LTH1 and a second opening array layer LTHL2 including second openings LTH2. The first opening array layer LTHL1 may be a first layer (for example, a first conductive layer) of the circuit element layer BPL and the second opening array layer LTHL2 may be a second layer (for example, a second conductive layer) of the circuit element layer BPL.

The first openings LTH1 and the second openings LTH2 may overlap with each other. The first openings LTH1 and the second openings LTH2 may have the same or different sizes.

For example, as shown in FIG. 12A, the first and second openings LTH1 and LTH2 may have substantially the same width (or diameter) and may be disposed so as to overlap with each other. In such an embodiment, the first and second openings LTH1 and LTH2 may configure the pinholes PIH of a multilayer structure. For example, the first openings LTH1 may configure first pinholes PIH1 disposed in the first layer of the circuit element layer BPL and the second openings LTH2 may configure the second pinholes PIH2 disposed in the second layer of the circuit element layer BPL. In this case, the first opening array layer LTHL1 including the first openings LTH1 and the second opening array layer LTHL2 including the second openings LTH2 may configure the light blocking layer PHL of a multilayer structure.

As shown in FIG. 12B, the first openings LTH1 may have a size smaller than that of the second openings LTH2. In such an embodiment, the first opening array layer LTHL1 including the first openings LTH1 may perform the function of the light control layer LBL controlling the path of the light, and the second opening array layer LTHL2 including the second openings LTH2 may replace the light blocking layer PHL performing the light blocking function.

As shown in FIG. 12C, the first openings LTH1 may have a size larger than that of the second openings LTH2. In such an embodiment, the first opening array layer LTHL1 including the first openings LTH1 may replace the light blocking layer PHL performing the light blocking function, and the second opening array layer LTHL2 including the second openings LTH2 may perform the function of the light control layer LBL controlling the path of the light.

Figure 13:
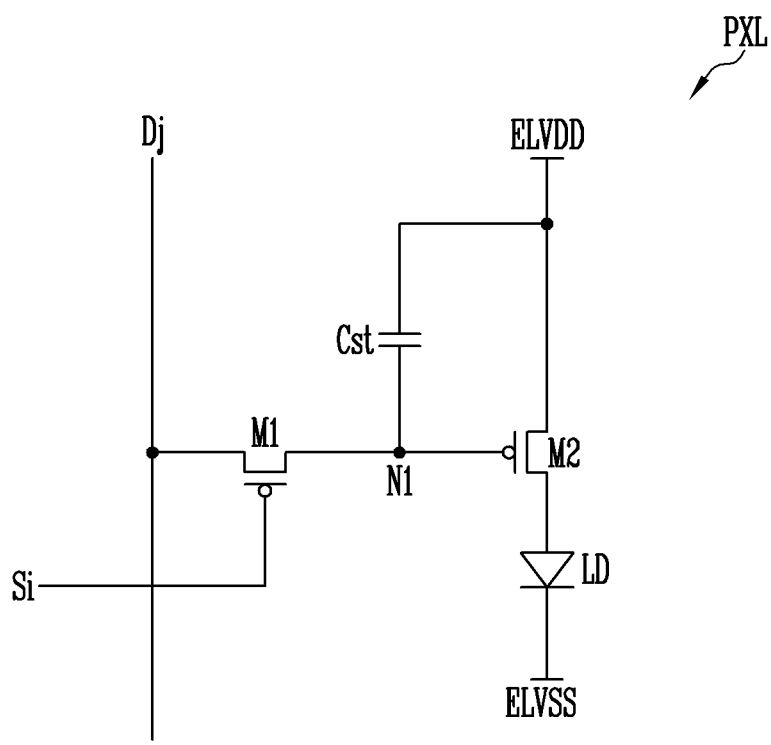
FIG. 13 is a circuit diagram illustrating a pixel according to an exemplary embodiment of the inventive concepts.

FIG. 13 is a circuit diagram illustrating a pixel according to an exemplary embodiment. In FIG. 13, for convenience of description, an active type pixel connected to an i-th (i is a natural number) scan line Si that is disposed in an i-th horizontal pixel column and a j-th (j is a natural number) data line Dj that is disposed in a j-th vertical pixel column and including two transistors is shown. However, a structure of the pixel PXL is not limited to a structure shown in FIG. 13.

Referring to FIG. 13, the pixel PXL according to an exemplary embodiment may include a first transistor M1, a second transistor M2, a storage capacitor Cst, and a light emitting element LD.

The first transistor M1 (driving transistor) is connected between the j-th data line Dj and a first node N1 and a gate electrode of the first transistor M1 is connected to the scan line Si. The first transistor M1 is turned on when a scan signal having a gate-on voltage (for example, a low voltage) is supplied from the scan line Si. When the first transistor M1 is turned on, the j-th data line Dj and the first node N1 may be electrically connected with each other.

The second transistor M2 (switching transistor) is connected between first power ELVDD and the light emitting element LD and a gate electrode of the second transistor M2 is connected to the first node N1. The second transistor M2 controls an amount of a current supplied from the first power ELVDD to second power ELVSS through the light emitting element LD in correspondence with a voltage of the first node N1. In various embodiments, the first power ELVDD may be a high potential pixel power and the second power ELVSS may be a low potential pixel power.

The storage capacitor Cst is connected between the first power ELVDD and the first node N1. The storage capacitor Cst may store a voltage corresponding to a data signal supplied to the first node N1.

The light emitting element LD is connected between the second transistor M2 and the second power ELVSS. The light emitting element LD emits light at a luminance corresponding to the current controlled by the second transistor M2. In various embodiments, the light emitting element LD may be an organic light emitting diode (OLED).

Figure 14:
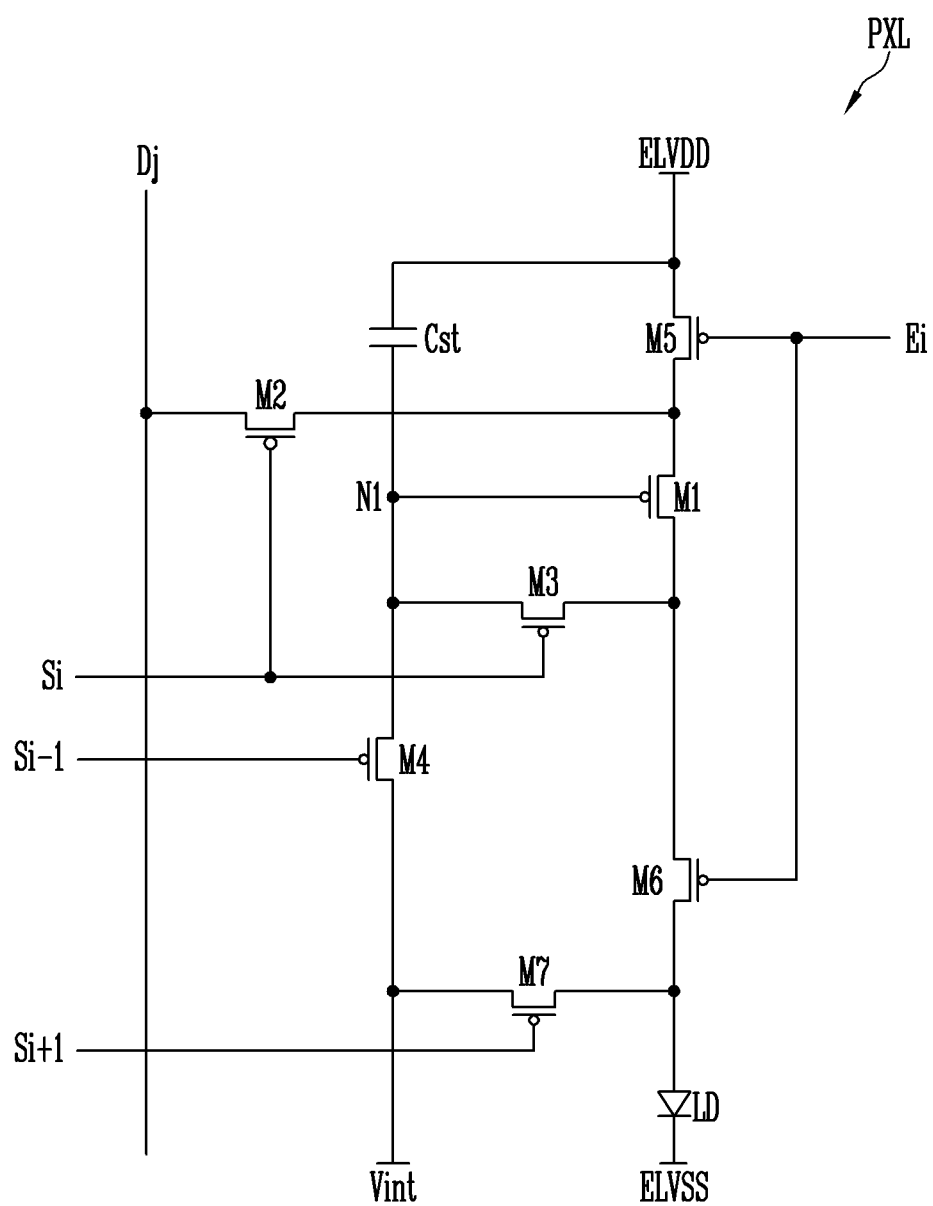
FIG. 14 is a circuit diagram illustrating a pixel according to another embodiment of the inventive concepts.

FIG. 14 is a circuit diagram illustrating a pixel according to another embodiment. In FIG. 14, for convenience of description, an active type pixel connected to an i-th (i is a natural number) scan line Si that is disposed in an i-th horizontal pixel column and a j-th (j is a natural number) data line Dj that is disposed in a j-th vertical pixel column and including seven transistors is shown. However, a structure of the pixel PXL is not limited to a structure shown in FIG. 14.

Referring to FIG. 14, the pixel PXL according to another embodiment may include first to seventh transistors M1 to M7, a storage capacitor Cst, and a light emitting element LD.

A first electrode of the first transistor M1 may be connected to first power ELVDD through the fifth transistor M5 and a second electrode of the first transistor M1 may be connected to an anode electrode the light emitting element LD through the sixth transistor M6. In addition, a gate electrode of the first transistor M1 may be connected to a first node N1. The first transistor M1 may control an amount of a current flowing from the first power ELVDD to second power ELVSS through the light emitting element LD in correspondence with a voltage of the first node N1.

The second transistor M2 (switching transistor) may be connected between the j-th data line Dj and the first electrode of the first transistor M1. In addition, a gate electrode of the second transistor M2 may be connected to the i-th scan line Si. The second transistor M2 may be turned on when a scan signal is supplied to the i-th scan line Si to electrically connect the j-th data line Dj and the first electrode of the first transistor M1 with each other.

The third transistor M3 may be connected between the second electrode of the first transistor M1 and the first node N1. In addition, a gate electrode of the third transistor M3 may be connected to the i-th scan line Si. The third transistor M3 may be turned on when a scan signal of a gate-on voltage is supplied to the i-th scan line Si to electrically connect the second electrode of the first transistor M1 and the first node N1 with each other. Therefore, when the third transistor M3 is turned on, the first transistor M1 may be connected in a diode form.

The fourth transistor M4 (initialization transistor) may be connected between the first node N1 and initialization power Vint. In addition, a gate electrode of the fourth transistor M4 may be connected to an (i−1)-th scan line Si−1. The fourth transistor M4 may be turned on when a scan signal is supplied to the (i−1)-th scan line Si−1 to supply a voltage of the initialization power Vint to the first node N1.

FIG. 14 shows an embodiment in which the (i−1)-th scan line Si−1 is used as an initialization control line for initializing a gate node of the first transistor M1, that is, the first node N1. However, the inventive concepts are not limited thereto. For example, in another embodiment, another control line such as an (i−2)-th scan line may be used as the initialization control line for initializing the gate node of the first transistor M1.

The fifth transistor M5 may be connected between the first power ELVDD and the first transistor M1. In addition, a gate electrode of the fifth transistor M5 may be connected to an i-th light emission control line Ei. The fifth transistor M5 may be turned off when a light emission control signal of a gate-off voltage is supplied to the i-th light emission control line Ei, and may be turned on in other cases.

The sixth transistor M6 may be connected between the first transistor M1 and the light emitting element LD. In addition, a gate electrode of the sixth transistor M6 may be connected to the i-th light emission control line Ei. The sixth transistor M6 may be turned off when the light emission control signal of the gate-off voltage is supplied to the i-th light emission control line Ei, and may be turned on in other cases.

The seventh transistor M7 may be connected between the initialization power Vint and a first electrode of the light emitting element LD, for example, an anode electrode. In addition, a gate electrode of the seventh transistor M7 may be connected to an (i+1)-th scan line Si+1. The seventh transistor may be turned on when a scan signal of a gate-on voltage (for example, a low level voltage) is supplied to the (i+1)-th scan line Si+1 to supply the voltage of the initialization power Vint to the anode electrode of the light emitting element LD. Here, the voltage of the initialization power Vint may be set to a voltage lower than the data signal. That is, the voltage of the initialization power Vint may be set to be equal to or less than a lowest voltage of the data signal.

FIG. 14 shows a case in which an anode initialization control line to which the gate electrode of the seventh transistor M7 is connected is the (i+1)-th scan line Si+1. However, the inventive concepts are not limited thereto. For example, in another embodiment, a scan signal of the same timing as that of the i-th scan line Si may be applied to the (i+1)-th scan line Si+1 (that is, the scan signal having the gate-on voltage may be applied to the i-th scan line Si and the (i+1)-th scan line Si+1 at the same time point).

The storage capacitor Cst may be connected between the first power ELVDD and the first node N1. The storage capacitor Cst may store a voltage corresponding to the data signal and a threshold voltage of the first transistor M1.

The anode electrode of the light emitting element LD may be connected to the first transistor M1 through the sixth transistor M6 and a cathode electrode of the light emitting element LD may be connected to the second power ELVSS. The light emitting element LD generates light of a predetermined luminance in correspondence with the amount of the current supplied from the first transistor M1. A voltage value of the first power ELVDD may be set to be higher than a voltage value of the second power ELVSS so that the current may flow to the light emitting element LD.

On the other hand, the structure of the pixel PXL is not limited to the embodiment shown in FIG. 14. For example, the currently known pixel circuits of various structures may be applied to the pixel PXL.

Figure 15:
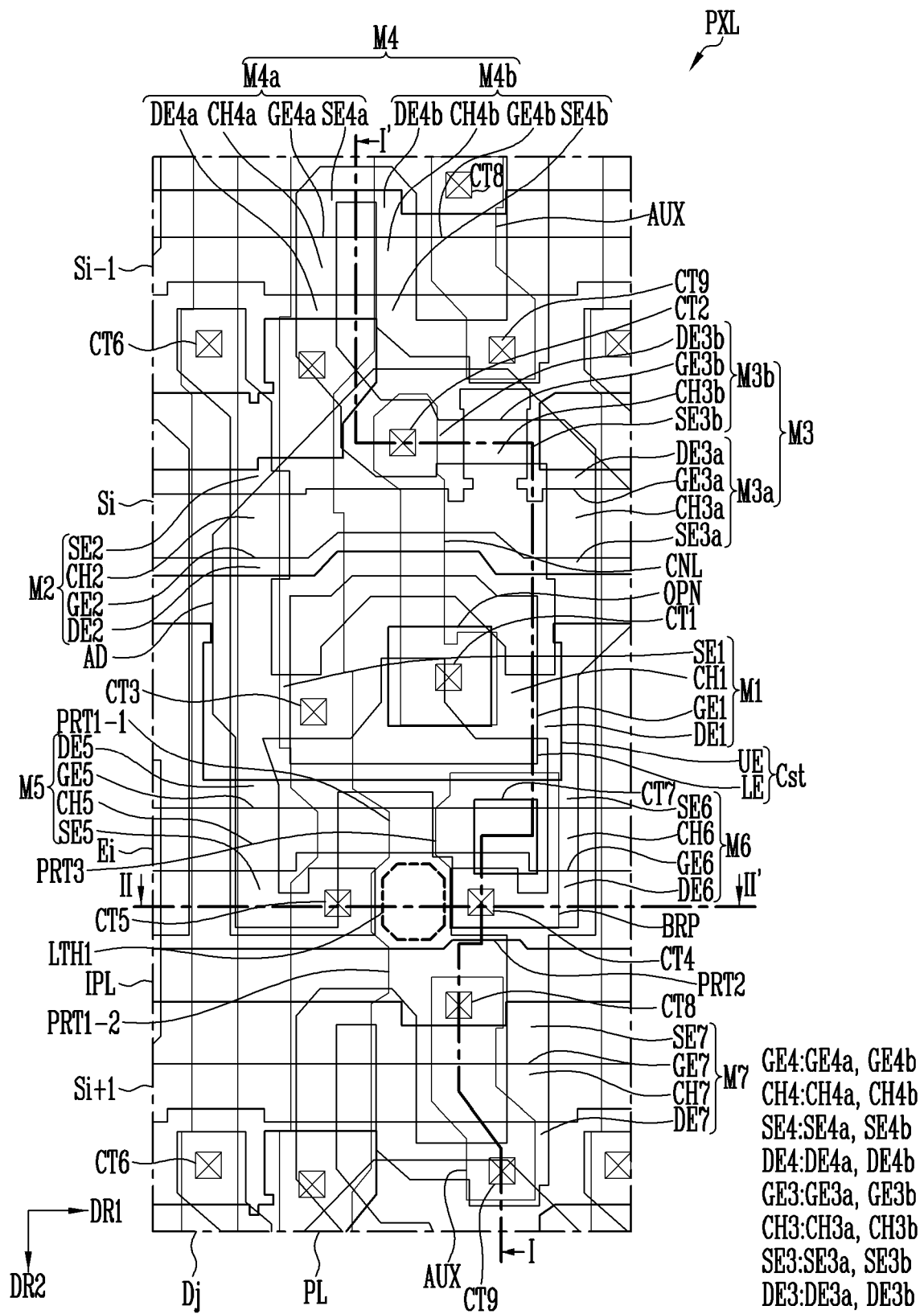
FIG. 15 is a plan view illustrating an embodiment of a layout of the pixel shown in FIG. 14.
Figure 16:
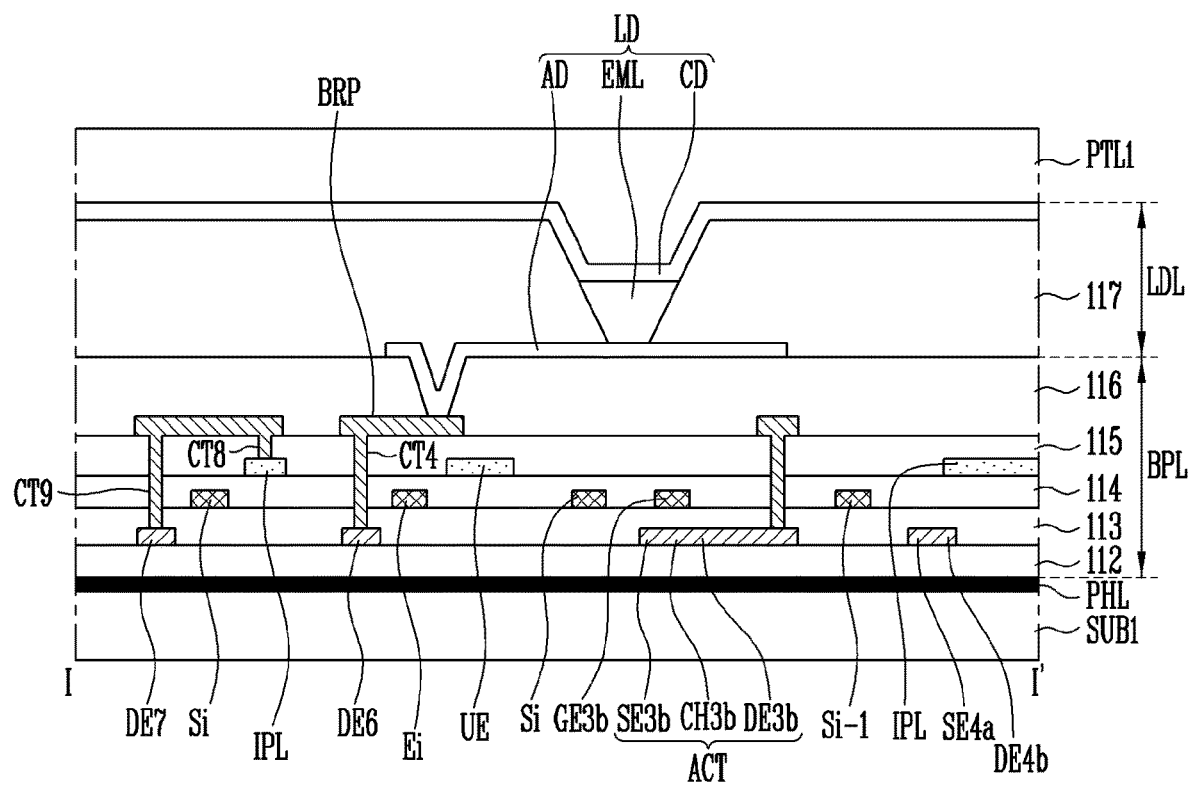
FIG. 16 is a cross-sectional view taken along a line I-I' of FIG. 15.
Figure 17:
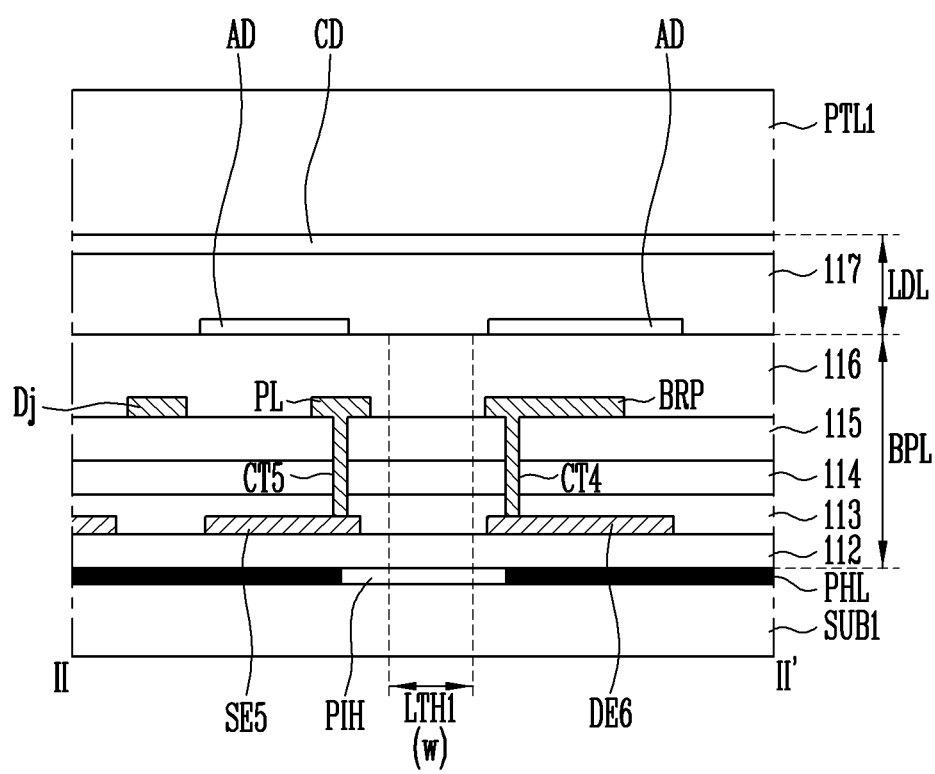
FIG. 17 is a cross-sectional view taken along a line II-II' of FIG. 15.
Figure 18:
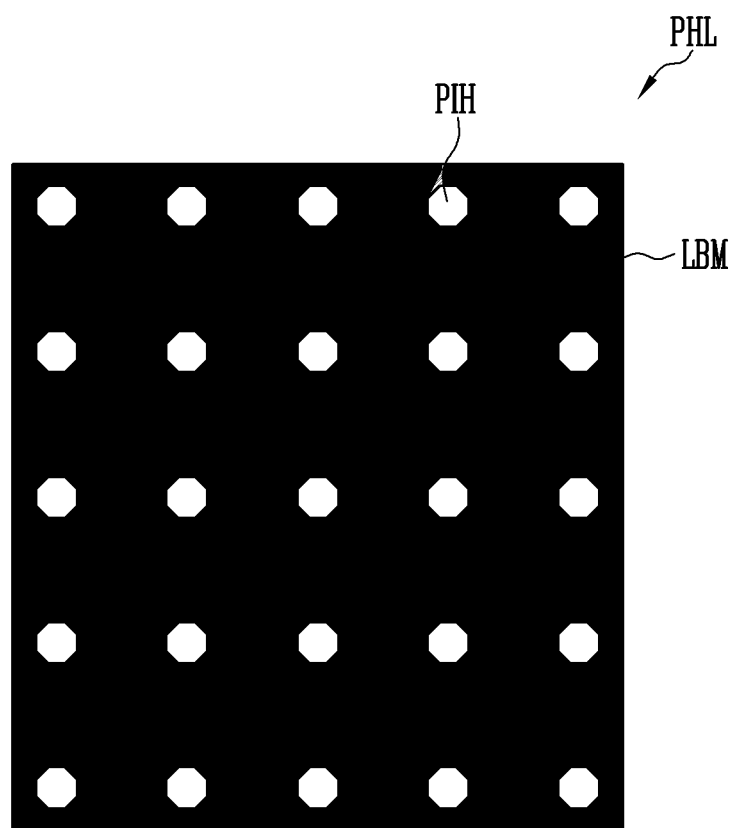
FIG. 18 is a plan view illustrating a light blocking layer according to the embodiment of FIG. 15.

FIG. 15 is a plan view illustrating an embodiment of a layout of the pixel shown in FIG. 14. Specifically, FIG. 15 shows a layout of the pixel PXL including the first opening LTH1 shown in, for example, FIG. 9 among arbitrary pixels PXL disposed in the display area AA of FIGS. 1 and 2. FIG. 16 is a cross-sectional view taken along a line I-I' of FIG. 15. FIG. 17 is a cross-sectional view taken along a line II-II' of FIG. 15. In FIG. 15, the light blocking layer PHL between the first substrate SUB1 and the circuit element layer BPL is omitted in order to preferably show the components in the pixel. However, as shown in FIGS. 16 and 17, the light blocking layer PHL may be further disposed between the first substrate SUB1 and the circuit element layer BPL. FIG. 18 is a plan view illustrating the light blocking layer according to the embodiment of FIG. 15.

In describing the embodiment of FIGS. 15 to 18, for convenience, a scan line of an (i−1)-th row is referred to as an "(i+1)-th scan line (Si+1)", a light emission control line of an i-th row is referred to as a "light emission control line Ei", a data line of a j-th column is referred to as a "data line Dj", and a power line of the j-th column, for example, a power line of the j-th column, to which the first power ELVDD is applied, is referred to as a "power line PL".

Referring to FIGS. 15 to 18 with the embodiments described above, the display device 10 may include the pixels PXL disposed in the display area AA and a wire portion for supplying the driving signals and/or power to the pixels PXL. The wire portion may include the scan lines Si−1, Si, and Si+1, the data line Dj, the light emission control line Ei, the power line PL, and an initialization power line IPL.

The scan lines Si−1, Si, and Si+1 may extend in a first direction DR1 in the sensing area SA. The scan lines Si−1, Si, and Si+1 may include the (i−1)-th scan line Si−1, the i-th scan line Si, and the (i+1)-th scan line Si+1 that are sequentially arranged along a second direction DR2 crossing the first direction DR1. The scan lines Si−1, Si, and Si+1 may receive scan signals. For example, the (i+1)-th scan line Si−1 may receive an (i−1)-th scan signal, the i-th scan line Si may receive an i-th scan signal, and the (i+1)-th scan line Si+1 may receive an (i+1)-th scan signal.

The light emission control line Ei may extend in the first direction DR1 so as to be parallel to the scan lines Si−1, Si, and Si+1 in the sensing area SA. The light emission control line Ei may receive a light emission control signal.

The data line Dj may extend in the second direction DR2 in the sensing area SA. That is, the data line Dj may extend in a direction crossing control lines Si−1, Si, Si+1, and Ei including the scan lines Si−1, Si, and Si+1 and the light emission control line Ei. The data line Dj may receive a data signal.

The power line PL may extend along the second direction DR2 in the sensing area SA, but is not limited thereto. The power line PL may be disposed to be spaced apart from the data line Dj and may receive the first power ELVDD. The power line PL may have a shape protruding in the first direction DR1 in at least one region. For example, the power line PL may include at least two first protrusion portions PRT1-1 and PRT1-2 spaced apart from each other at a predetermined distance. That is, the first protrusion portions PRT1-1 and PRT1-2 may protrude toward an adjacent bridge pattern BRP in plan view.

For example, at least one protrusion portion PRT1-1 of the first protrusion portions PRT1-1 and PRT1-2 may overlap the light emission control line Ei. That is, at least one protrusion portion PRT1-1 of the first protrusion portions PRT1-1 and PRT1-2 may partially overlap the light emission control line Ei. For example, at least a portion of the other protrusion portion PRT1-2 of the first protrusion portions PRT1-1 and PRT1-2 may overlap the initialization power line IPL. That is, the other protrusion portion PRT1-2 of the first protrusion portions PRT1-1 and PRT1-2 may partially overlap the initialization power line IPL.

The first protrusion portions PRT1-1 and PRT1-2 may have an angular shape. For example, the first protrusion portions PRT1-1 and PRT1-2 may have a semi-hexagonal planar shape or a trapezoidal planar shape. In this case, at least one side of each of the first protrusion portions PRT1-1 and PRT1-2 may extend in a direction (for example, an oblique direction) crossing each of the first direction DR1 and the second direction DR2. In addition, an internal angle of the first opening LTH1 corresponding to the first protrusion portions PRT1-1 and PRT1-2 may be an obtuse angle.

However, the inventive concepts are not limited thereto, and the first protrusion portions PRT1-1 and PRT1-2 may have various planar shapes, such as a semi-polygon, a semi-circle, and a semi-ellipse, and the first protrusion portions PRT1-1 and PRT1-2 may have the same or different planar shape.

The initialization power line IPL may extend along the first direction DR1 in the sensing area SA, but is not limited thereto. The initialization power line IPL may receive the initialization power Vint. The initialization power line IPL may have a shape protruding in a direction opposite to the second direction DR2 in at least one region. For example, the initialization power line IPL may include a second protrusion portion PRT2. The second protrusion portion PRT2 may protrude toward the light emission control line Ei (or the bridge pattern BRP) in plan view. For example, the second protrusion portion PRT2 may be formed adjacent to a sixth drain electrode DE6.

Similar to the first protrusion portions PRT1-1 and PRT1-2, the second protrusion portion PRT2 may have an angular shape. For example, the second protrusion portion PRT2 may have a semi-hexagonal planar shape or a trapezoidal planar shape. However, the inventive concepts are not limited thereto, and the second protrusion portion PRT2 may have various planar shapes, such as a semi-polygon, a semi-circle, and a semi-ellipse.

In an exemplary embodiment, the pixel PXL may include the first to seventh transistors M1 to M7, the storage capacitor Cst, and the light emitting element LD as shown in FIG. 17.

The first transistor M1 may include a first gate electrode GE1, a first source electrode SE1, and a first drain electrode DE1.

In an embodiment, the first gate electrode GE1 may be disposed so as to overlap a first channel CH1 of an active pattern, with at least one insulating layer, for example a gate insulating layer 113 interposed therebetween. The first gate electrode GE1 may be connected to a third drain electrode DE3 (including DE3a and DE3b) of the third transistor M3 and a fourth source electrode SE4 (including SE4a and SE4b) of the fourth transistor M4.

The first gate electrode GE1 may be connected to a third drain electrode DE3 and a fourth source electrode SE4 by a connection wire CNL. One end of the connection line CNL may be connected to the first gate electrode GE1 through a first contact hole CT1 and the other end of the connection line CNL may be connected to the third drain electrode DE3 and the fourth source electrode SE4 through a second contact hole CT2.

In an exemplary embodiment, the first channel CH1, the first source electrode SE1, and the first drain electrode DE1 may be formed of a semiconductor pattern in which an impurity is not doped or an impurity is doped. For example, the first source electrode SE1 and the first drain electrode DE1 may be formed of a semiconductor pattern in which an impurity is doped, and the first channel CH1 may be formed of a semiconductor pattern in which an impurity is not doped.

The first channel CH1 may have a shape extending in an arbitrary direction and may have a shape bent several times along the extended longitudinal direction. The first channel CH1 may overlap the first gate electrode GE1 when viewed in plan view. A channel region of the first transistor M1 may be formed to be long by forming the first channel CH1 to be long. Therefore, a driving range of a gate voltage applied to the first transistor M1 is widened. Thus, a grayscale of the light emitted from the light emitting element LD may be finely controlled.

The first source electrode SE1 may be connected to one end of the first channel CH1. The first source electrode SE1 may be connected to a second drain electrode DE2 of the second transistor M2 and a fifth drain electrode DE5 of the fifth transistor M5. In an embodiment, the first drain electrode DE1 may be connected to the other end of the first channel CH1. The first drain electrode DE1 may be connected to a third source electrode SE3 of the third transistor M3 and a sixth source electrode SE6 of the sixth transistor M6.

The second transistor M2 may include a second gate electrode GE2, a second channel CH2, a second source electrode SE2, and a second drain electrode DE2.

The second gate electrode GE2 may be disposed so as to overlap a second channel CH2, with at least one insulating layer, for example, the gate insulating layer 113 interposed therebetween. The second gate electrode GE2 may be connected to the i-th scan line Si.

The second channel CH2, the second source electrode SE2, and the second drain electrode DE2 may be formed of a semiconductor pattern in which an impurity is not doped or an impurity is doped. For example, the second source electrode SE2 and the second drain electrode DE2 may be formed of a semiconductor pattern in which an impurity is doped, and the second channel CH2 may be formed of a semiconductor pattern in which an impurity is not doped. The second channel CH2 may correspond to a portion overlapping the second gate electrode GE2.

One end of the second source electrode SE2 may be connected to the second channel CH2 and the other end of the second source electrode SE2 may be connected to the data line Dj through a sixth contact hole CT6. In an embodiment, one end of the second drain electrode DE2 may be connected to the second channel CH2 and the other end of the second drain electrode DE2 may be connected to the first source electrode SE1 of the first transistor M1 and the fifth drain electrode DE5 of the fifth transistor M5.

The third transistor M3 may be provided with a double gate structure to prevent a leakage current. That is, the third transistor M3 may include 3a-th transistor M3a and a 3b-th transistor M3b. The 3a-th transistor M3a may include a 3a-th gate electrode GE3a, a 3a-th channel CH3a, a 3a-th source electrode SE3a, and a 3a-th drain electrode DE3a. The 3b-th transistor M3b may include a 3b-th gate electrode GE3b, a 3b-th channel CH3b, a 3b-th source electrode SE3b, and a 3b-th drain electrode DE3b. Hereinafter, the 3a-th gate electrode GE3a and the 3b-th gate electrode GE3b are referred to as a third gate electrode GE3, the 3a-th channel CH3a and the 3b-th channel CH3b are referred to as a third channel CH3, the 3a-th source electrode SE3a and the 3b-th source electrode SE3b are referred to as a third source electrode SE3, and the 3a-th drain electrode DE3a and the 3b-th drain electrode DE3b are referred to as a third drain electrode DE3.

The third gate electrode GE3 may be disposed so as to overlap the third channel CH3, with at least one insulating layer, for example, the gate insulating layer 113 interposed therebetween. The third gate electrode GE3 may be connected to the i-th scan line Si.

The third channel CH3, the third source electrode SE3, and the third drain electrode DE3 may be formed of a semiconductor pattern in which an impurity is not doped or the impurity is doped. For example, the third source electrode SE3 and the third drain electrode DE3 may be formed of a semiconductor pattern in which an impurity is doped, and the third channel CH3 may be formed of a semiconductor pattern in which an impurity is not doped. The third channel CH3 corresponds to a portion overlapping the third gate electrode GE3.

One end of the third source electrode SE3 may be connected to the third channel CH3 and the other end of the third source electrode SE3 may be connected to the first drain electrode DE1 of the first transistor M1 and the sixth source electrode SE6 of the sixth transistor M6. In an embodiment, one end of the third drain electrode DE3 may be connected to the third channel CH3 and the other end of the third drain electrode DE3 may be connected to the fourth source electrode SE4 of the fourth transistor M4. In addition, the third drain electrode DE3 may be connected to the first gate electrode GE1 of the first transistor M1 through the connection line CNL, the second contact hole CT2, and the first contact hole CT1.

The fourth transistor M4 may be provided with a double gate structure to prevent a leakage current. That is, the fourth transistor M4 may include 4a-th transistor M4a and a 4b-th transistor M4b. The 4a-th transistor M4a may include a 4a-th gate electrode GE4a, a 4a-th channel CH4a, a 4a-th source electrode SE4a, and a 4a-th drain electrode DE4a. The 4b-th transistor M4b may include a 4b-th gate electrode GE4b, a 4b-th channel CH4b, a 4b-th source electrode SE4b, and a 4b-th drain electrode DE4b. Hereinafter, the 4a-th gate electrode GE4a and the 4b-th gate electrode GE4b are referred to as a fourth gate electrode GE4, the 4a-th channel CH4a and the 4b-th channel CH4b are referred to as a fourth channel CH4, the 4a-th source electrode SE4a and the 4b-th source electrode SE4b are referred to as a fourth source electrode SE4, and the 4a-th drain electrode DE4a and the 4b-th drain electrode DE4b are referred to as a fourth drain electrode DE4.

The fourth gate electrode GE4 may be disposed so as to overlap the fourth channel CH4, with at least one insulating layer, for example, the gate insulating layer 113 interposed therebetween. The fourth gate electrode GE4 may be connected to the (i−1)-th scan line Si−1.

The fourth channel CH4, the fourth source electrode SE4, and the fourth drain electrode DE4 may be formed of a semiconductor pattern in which an impurity is not doped or an impurity is doped. For example, the fourth source electrode SE4 and the fourth drain electrode DE4 may be formed of a semiconductor pattern in which an impurity is doped, and the fourth channel CH4 may be formed of a semiconductor pattern in which an impurity is not doped. The fourth channel CH4 corresponds to a portion overlapping the fourth gate electrode GE4.

One end of the fourth source electrode SE4 may be connected to the fourth channel CH4 and the other end of the fourth source electrode SE4 may be connected to the third drain electrode DE3 of the third transistor M3. In addition, the fourth source electrode SE4 may be connected to the first gate electrode GE1 of the first transistor M1 through the connection line CNL, the second contact hole CT2, and the first contact hole CT1. One end of the fourth drain electrode DE4 may be connected to the fourth channel CH4 and the other end of the fourth drain electrode DE4 may be connected to a seventh drain electrode DE7 of the seventh transistor M7 of the pixel PXL of the (i−1)-th row. The fourth drain electrode DE4 may be connected to the initialization power line IPL through an auxiliary connection wire AUX, a ninth contact hole CT9, and an eighth contact hole CT8.

The fifth transistor M5 may include a fifth gate electrode GE5, a fifth channel CH5, a fifth source electrode SE5, and a fifth drain electrode DE5.

The fifth gate electrode GE5 may be disposed so as to overlap the fifth channel CH5, with at least one insulating layer, for example, the gate insulating layer 113 interposed therebetween. The fifth gate electrode GE5 may be connected to the light emission control line Ei.

The fifth channel CH5, the fifth source electrode SE5, and the fifth drain electrode DE5 may be formed of a semiconductor pattern in which an impurity is not doped or an impurity is doped. For example, the fifth source electrode SE5 and the fifth drain electrode DE5 may be formed of a semiconductor pattern in which an impurity is doped, and the fifth channel CH5 may be formed of a semiconductor pattern in which an impurity is not doped. The fifth channel CH5 corresponds to a portion overlapping the fifth gate electrode GE5.

One end of the fifth source electrode SE5 may be connected to the fifth channel CH5 and at least one portion of the other end of the fifth source electrode SE5 may overlap the power line PL and may be connected to the power line PL through a fifth contact hole CT5. In an embodiment, one end of the fifth drain electrode DE5 may be connected to the fifth channel CH5 and the other end of the fifth drain electrode DE5 may be connected to the first source electrode SE1 of the first transistor M1 and the second drain electrode DE2 of the second transistor M2.

The sixth transistor M6 may include a sixth gate electrode GE6, a sixth channel CH6, the sixth source electrode SE6, and the sixth drain electrode DE6.

The sixth gate electrode GE6 may be disposed so as to overlap the sixth channel CH6, with at least one insulating layer, for example, the gate insulating layer 113 interposed therebetween. The sixth gate electrode GE6 may be connected to the light emission control line Ei.

The sixth channel CH6, the sixth source electrode SE6, and the sixth drain electrode DE6 are formed of a semiconductor pattern in which an impurity is not doped or an impurity is doped. For example, the sixth source electrode SE6 and the sixth drain electrode DE6 may be formed of a semiconductor pattern in which an impurity is doped, and the sixth channel CH6 may be formed of a semiconductor pattern in which an impurity is not doped. The sixth channel CH6 corresponds to a portion overlapping the sixth gate electrode GE6.

One end of the sixth source electrode SE6 may be connected to the sixth channel CH6 and the other end of the sixth source electrode SE6 may be connected to the first drain electrode DE1 of the first transistor M1 and the third source electrode SE3 of the third transistor M3. In an embodiment, one end of the sixth drain electrode DE6 may be connected to the sixth channel CH6 and the other end of the sixth drain electrode DE6 may be connected to the seventh source electrode SE7 of the seventh transistor M7. In an embodiment, the sixth drain electrode DE6 may be disposed to be spaced apart from the fifth source electrode SE5 by a predetermined distance.

The seventh transistor M7 may include a seventh gate electrode GE7, a seventh channel CH7, the seventh source electrode SE7, and the seventh drain electrode DE7.

The seventh gate electrode GE7 may be disposed so as to overlap the seventh channel CH7, with at least one insulating layer, for example, the gate insulating layer 113 interposed therebetween. The seventh gate electrode GE7 may be connected to the (i+1)-th scan line Si+1.

The seventh channel CH7, the seventh source electrode SE7, and the seventh drain electrode DE7 may be formed of a semiconductor pattern in which an impurity is not doped or an impurity is doped. For example, the seventh source electrode SE7 and the seventh drain electrode DE7 may be formed of a semiconductor pattern in which an impurity is doped, and the seventh channel CH7 may be formed of a semiconductor pattern in which an impurity is not doped. The seventh channel CH7 corresponds to a portion overlapping the seventh gate electrode GE7.

One end of the seventh source electrode SE7 may be connected to the seventh channel CH7 and the other end of the seventh source electrode SE7 may be connected to the sixth drain electrode DE6 of the sixth transistor M6. In an embodiment, one end of the seventh drain electrode DE7 may be connected to the seventh channel CH7 and the other end of the seventh drain electrode DE7 may be connected to the initialization power line IPL through the auxiliary connection wire AUX, the ninth contact hole CT9, and the eighth contact hole CT8.

The storage capacitor Cst may include a first capacitor electrode LE and a second capacitor electrode UE. In an embodiment, the first capacitor electrode LE may be a lower electrode of the storage capacitor Cst and may be formed integrally with the first gate electrode GE1 of the first transistor M1. In an embodiment, the second capacitor electrode UE may be an upper electrode of the storage capacitor Cst and may overlap the first gate electrode GE1. In addition, as viewed in plan view, the second capacitor electrode UE may cover at least one area of the first capacitor electrode LE. A capacitance of the storage capacitor Cst may be increased by enlarging the overlapping area of the first capacitor electrode LE and the second capacitor electrode UE.

The second capacitor electrode UE may extend in the first direction DR1. In an exemplary embodiment, a voltage of the same level as that of the first power ELVDD may be applied to the second capacitor electrode UE. The second capacitor electrode UE may have an opening portion OPN in an area where the first contact hole CT1 in which the first gate electrode GE1 and the connection wire CNL are in contact with each other is formed.

The light emitting element LD may include a first electrode (for example, an anode electrode) AD, a second electrode (for example, a cathode electrode) CD, and a light emitting layer EML provided between the first electrode AD and the second electrode CD. In an embodiment, the first electrode AD and the second electrode CD are disposed to overlap with each other in a light emission area of the light emitting element layer LDL and the light emitting layer EML may be formed in the light emission area. That is, the light emission area of each pixel PXL may be an area where the first electrode AD, the light emitting layer EML, and the second electrode CD of the light emitting element LD overlap each other.

The first electrode AD may be provided in a predetermined light emission area. The first electrode AD may be connected to the seventh source electrode SE7 of the seventh transistor M7 and the sixth drain electrode DE6 of the sixth transistor M6 through a fourth contact hole CT4 and a seventh contact hole CT7.

A bridge pattern BRP may be provided between the fourth contact hole CT4 and the seventh contact hole CT7. The bridge pattern BRP may connect the sixth drain electrode DE6, the seventh source electrode SE7, and the first electrode AD. The bridge pattern BRP may have a shape protruding in a direction opposite to the first direction DR1 in one region. For example, the bridge pattern BRP may include a third protrusion portion PRT3 formed in the direction opposite to the first direction DR1 in one region. That is, the third protrusion portion PRT3 may protrude toward the power line PL (or one of the first protrusion portions PRT1-1 and PRT1-2 of the power line PL).

For example, at least a portion of the third protrusion portion PRT3 may overlap the light emission control line Ei. For example, the third protrusion portion PRT3 may be disposed to correspond to the spaced apart area of the first protrusion portions PRT1-1 and PRT1-2, or may be disposed to face one protrusion portion PRT1-1 of the first protrusion portions PRT1-1 and PRT1 of the power line PL.

The third protrusion portion PRT3 may have an angular shape. For example, the third protrusion portion PRT3 may have a semi-hexagonal shape. However, the inventive concepts are not limited thereto, and the third protrusion portion PRT3 may have various shapes such as a semi-polygon, a semi-circle, and a semi-ellipse.

Hereinafter, the stacked structure (cross-sectional structure) of the pixel PXL and the sensing area SA including the pixel PXL according to an exemplary embodiment will be described.

First, a buffer layer 112 may be provided on the first surface of the first substrate SUB1. The buffer layer 112 may prevent or reduce a phenomenon in which metal atoms or impurities diffuse from the first substrate SUB1 (for example, outgassing). In addition, when the surface of the first substrate SUB1 is not uniform, the buffer layer 112 may serve to improve surface flatness of the first substrate SUB1. The buffer layer 112 may include an inorganic material, such as an oxide or a nitride, or an organic material, or an organic-inorganic composite, and may be formed of a single layer or a multi-layer structure of an inorganic material and an organic material. For example, the buffer layer 112 may have a structure of at least triple layers formed of silicon oxide, silicon nitride, and silicon oxide.

Active pattern ACT may be provided on the buffer layer 112. In an embodiment, the active patterns ACT may include the first to seventh channels CH1 to CH7. The first to seventh channels CH1 to CH7 may be formed of a semiconductor material.

The gate insulating layer 113 may be provided on the buffer layer 112 on which the first to seventh channels CH1 to CH7 are provided. In an embodiment, the gate insulating layer 113 may be a gate insulating film interposed between the active patterns ACT and the gate electrodes GE1 to GE7 of the transistors M1 to M7 included in the pixels PXL.

The gate insulating layer 113 may include at least one inorganic film and/or organic film. For example, the gate insulating layer 113 may be formed of an inorganic film including $SiO_X$, $SiN_X$, or the like, but is not limited thereto. For example, the gate insulating layer 113 may include an inorganic insulating material or an organic insulating material such as $SiO_X$, $SiN_X$, SiON, SiOF, or $AlO_X$, and may be a single film or multiple films including at least one of these materials.

The first conductive layer may be disposed on the gate insulating layer 113. In an embodiment, the first conductive layer may be a first gate layer. The first conductive layer may be provided with the control lines Si−1, Si, Si+1, and Ei and the gate electrodes GE1 to GE7. In addition, one electrode of the storage capacitor Cst, for example, the first capacitor electrode LE may be provided in the first conductive layer. Specifically, the (i−1)-th scan line Si−1, the i-th scan line Si, the (i+1)-th scan line Si+1, the light emission control line Ei, and the first to seventh gate electrodes GE1 to GE7 may be provided in the first conductive layer on the gate insulating layer 113. In an embodiment, the first gate electrode GE1 may also be the first capacitor electrode LE of the storage capacitor Cst. That is, the first gate electrode GE1 and the first capacitor electrode LE may be integrally formed.

The control lines Si−1, Si, Si+1, and Ei, the gate electrodes GE1 to GE7, and/or the first capacitor electrode LE that is the lower electrode of the storage capacitor Cst disposed in the first conductive layer may be configured of the same material. For example, the control lines Si−1, Si, Si+1, and Ei, the gate electrodes GE1 to GE7, and/or the first capacitor electrode LE of the storage capacitor Cst may be formed of a predetermined first gate metal.

Examples of a material capable of configuring the first gate metal may include Ti, Cu, Mo, Al, Au, Cr, TiN, Ag, Pt, Pd, Ni, Sn, Co, Rh, Ir, Fe, Ru, Os, Mn, W, Nb, Ta, Bi, Sb, Pb, and the like, and other various metals may be used as the material capable of configuring the first gate metal. Examples of an alloy capable of configuring the first gate metal may include MoTi, AlNiLa, and the like, and other various alloys may be used as the alloy capable of configuring the first gate metal. Examples of the multiple films capable of configuring the first gate metal may include Ti/Cu, Ti/Au, Mo/Al/Mo, ITO/Ag/ITO, TiN/Ti/Al/Ti, TiN/Ti/Cu/Ti, and the like, and other various conductive materials of multiple films structure may be used as the multiple films capable of configuring the first gate metal.

On the other hand, the configuration material of the control lines Si−1, Si, Si+1, and Ei, the gate electrodes GE1 to GE7, and/or the first capacitor electrode LE is not necessarily limited to metal. That is, a material capable of providing conductivity enough to smoothly drive the pixels PXL may be used as the material configuring the control lines Si−1, Si, Si+1, and Ei, the gate electrodes GE1 to GE7, and/or the first capacitor electrode LE.

For example, the control lines Si−1, Si, Si+1, and Ei, the gate electrodes GE1 to GE7, and/or the first capacitor electrode LE may be configured of a conductive polymer or a conductive metal oxide. Examples of the conductive polymer capable of configuring the control lines Si−1, Si, Si+1, and Ei, the gate electrodes GE1 to GE7, and/or the first capacitor electrode LE may include polythiophene based compound, polypyrrole based compound, polyaniline based compound, polyacetylene based compound, polyphenylene based compound, mixtures thereof, and the like, and particularly, among the polythiophene based compounds, PEDOT/PSS compound may be used. Examples of the conductive metal oxide capable of configuring the control lines Si−1, Si, Si+1, and Ei, the gate electrodes GE1 to GE7, and/or the first capacitor electrode LE may include ITO, IZO, AZO, ITZO, ZnO, $SnO_2$, and the like.

A first interlayer insulating layer 114 may be provided on the first conductive layer. In an embodiment, the first interlayer insulating layer 114 may be a first interlayer insulating film interposed between the first capacitor electrode LE and the second capacitor electrode UE. In an embodiment, the first interlayer insulating layer 114 may have a thickness limited to a predetermined range in order to sufficiently secure a capacity of the storage capacitor Cst within a limited area.

The first interlayer insulating layer 114 may include an inorganic film and/or an organic film of one or more layers. For example, the first interlayer insulating layer 114 may be configured of an inorganic film including $SiO_X$, $SiN_X$, or the like, but is not limited thereto. For example, the first interlayer insulating layer 114 may include an inorganic insulating material such as $SiO_X$, $SiN_X$, SiON, SiOF, or $AlO_X$, or an organic insulating material, and may be a single film or multiple films including at least one of these materials.

The second conductive layer may be disposed on the first interlayer insulating layer 114. In an embodiment, the second conductive layer may be a second gate layer.

The second conductive layer may be provided with the second capacitor electrode UE and the initialization power line IPL. In an embodiment, the second capacitor electrode UE may cover the first capacitor electrode LE. The second capacitor electrode UE overlaps the first capacitor electrode LE, with the first interlayer insulating layer 114 interposed therebetween to form the storage capacitor Cst together with the first capacitor electrode LE. The initial power line IPL may extend along the first direction DR1 in the display area AA, but is not limited thereto. The initialization power line IPL may receive the initialization power Vint.

The second capacitor electrode UE and the initialization power line IPL disposed in the second conductive layer may be configured of the same material. For example, the second capacitor electrode UE and the initialization power line IPL may be formed of a predetermined second gate metal. In an embodiment, the second gate metal may be one of the metal materials previously presented as the example of the first gate metal, but is not limited thereto. In addition, the configuration material of the second capacitor electrode UE and the initialization power line IPL disposed in the second conductive layer is not necessarily limited to metal. That is, a material capable of providing conductivity enough to smoothly drive the pixels PXL may be used as the material configuring the second capacitor electrode UE and the initialization power line IPL. For example, the second capacitor electrode UE and the initialization power line IPL disposed in the second conductive layer may be configured of a conductive polymer or a conductive metal oxide.

A second interlayer insulating layer 115 may be provided on the second conductive layer. In an embodiment, the second interlayer insulating layer 115 may be a second interlayer insulating film.

The second interlayer insulating layer 115 may include an inorganic film and/or an organic film of one or more layers. For example, the second interlayer insulating layer 115 may be configured of an inorganic film including $SiO_X$, $SiN_X$, or the like, but is not limited thereto. For example, the second interlayer insulating layer 115 may include an inorganic insulating material such as $SiO_X$, $SiN_X$, SiON, SiOF, or $AlO_X$, or an organic insulating material, and may be a single film or multiple films including at least one of these materials.

A third conductive layer may be disposed on the second interlayer insulating layer 115. In an embodiment, the third conductive layer may be a source-drain layer.

The third conductive layer may be provided with the data line Dj, the power line PL, the connection wire CNL, the bridge pattern BRP, and the auxiliary connection wire AUX.

The data line Dj may be electrically connected to the second source electrode SE2 through the sixth contact hole CT6 passing through the gate insulating layer 113, the first interlayer insulating layer 114, and the second interlayer insulating layer 115.

The power line PL may be connected to the second capacitor electrode UE that is the upper electrode of the storage capacitor Cst through the third contact hole CT3 passing through the second interlayer insulating layer 115. In addition, the power line PL may be connected to the fifth source electrode SE5 through the fifth contact hole CT5 passing through the gate insulating layer 113, the first interlayer insulating layer 114, and the second interlayer insulating layer 115.

The connection wire CNL may be connected to the first gate electrode GE1 through the first contact hole CT1 passing through the first interlayer insulating layer 114 and the second interlayer insulating layer 115. In addition, the connection wire CNL may be electrically connected to the third drain electrode DE3 and the fourth source electrode SE4 through the second contact hole CT2 passing through the gate insulating layer 113, the first interlayer insulating layer 114, and the second interlayer insulating layer 115.

The bridge pattern BRP may be a pattern provided as a medium connecting the sixth drain electrode DE6 and the first electrode AD between the sixth drain electrode DE6 and the first electrode AD. The bridge pattern BRP may be electrically connected to the sixth drain electrode DE6 and the seventh source electrode SE7 through the fourth contact hole CT4 passing through the gate insulating layer 113, the first interlayer insulating layer 114, and the second interlayer insulating layer 115.

The auxiliary connection wire AUX may be connected to the initialization power line IPL through the eighth contact hole CT8 passing through the second interlayer insulating layer 115. In addition, the auxiliary connection wire AUX may be connected to the seventh drain electrode DE7 through the ninth contact hole CT9 passing through the gate insulating layer 113, the first interlayer insulating layer 114, and the second interlayer insulating layer 115.

The data line Dj, the power line PL, the connection wire CNL, the bridge pattern BRP and/or the auxiliary connection wire AUX disposed in the third conductive layer may be configured of the same material. For example, the data line Dj, the power line PL, the connection wire CNL, the bridge pattern BRP and/or the auxiliary connection wire AUX may be formed of a predetermined source drain metal.

The source drain metal may be one of the metal materials previously presented as the example of the first and/or second gate metal, but is not limited thereto. In addition, the configuration material of the data line Dj, the power line PL, the connection wire CNL, the bridge pattern BRP and/or the auxiliary connection wire AUX, which are disposed in the third conductive layer, is not necessarily limited to metal. That is, a material capable of providing conductivity enough to smoothly drive the pixels PXL may be used as the material configuring the data line Dj, the power line PL, the connection wire CNL, the bridge pattern BRP and/or the auxiliary connection wire AUX. For example, the data line Dj, the power line PL, the connection wire CNL, the bridge pattern BRP and/or the auxiliary connection wire AUX may be configured of a conductive polymer or a conductive metal oxide.

At least two of the first gate metal, the second gate metal, and the source drain metal may be formed of the same material. For example, the first gate metal and the second gate metal may be formed of the same material even though the first gate metal and the second gate metal are disposed on different layers. However, the inventive concepts are not limited thereto. For example, in another embodiment, all of the first gate metal, the second gate metal, and the source drain metal may be formed of different materials.

A protective layer 116 may be provided on the third conductive layer. In an embodiment, the protective layer 116 may include a passivation film and/or a planarization film. The protective layer 116 may include a seventh contact hole CT7 exposing a portion of the bridge pattern BRP.

The light emitting element LD may be provided on the protective layer 116. The light emitting element LD may include the first electrode AD, the second electrode CD, and the light emitting layer EML provided between the first and second electrodes AD and CD.

In an exemplary embodiment, the protective layer 116 may have a thickness of about 1500 Å to about 1800 Å, for example about 1600 Å, but the thickness of the protective layer 116 is not limited thereto.

At least one of the first electrode AD and the second electrode CD may be a transmissive electrode. For example, when the light emitting element LD is a back surface light emitting type organic light emitting display element, the first electrode AD may be a transmissive electrode and the second electrode CD may be a reflective electrode. On the other hand, when the light emitting element LD is a front surface light emitting type organic light emitting display element, the first electrode may be a reflective electrode and the second electrode may be a transmissive electrode. In addition, when the light emitting element LD is a both surface light emitting type organic light emitting display element, both of the first electrode AD and the second electrode CD may be transmissive electrodes. Hereinafter, a case where the light emitting element LD is a front surface light emitting type organic light emitting display element and the first electrode AD is an anode electrode will be described as an example. In addition, in the present embodiment, the light emitting element LD is used as a light source, but is the inventive concepts are not limited thereto. For example, the light emitting element LD may be replaced with another type of light emitting element.

The first electrode AD may be provided on the protective layer 116. The first electrode AD may be connected to the bridge pattern BRP through the seventh contact hole CT7 passing through the protective layer 116. Since the bridge pattern BRP is connected to the sixth drain electrode DE6 and the seventh source electrode SE7 through the fourth contact hole CT4, the first electrode AD may be finally connected to the sixth drain electrode DE6 and the seventh source electrode SE7 through the bridge pattern BRP.

The first electrode AD may include a reflective film (not shown) capable of reflecting light, and a transparent conductive film (not shown) disposed above or under the reflective film. At least one of the transparent conductive film and the reflective film may be connected to the sixth drain electrode DE6 and the seventh source electrode SE7.

The reflective film may include a material capable of reflecting light. For example, the reflective film may include at least one of aluminum (Al), silver (Ag), chromium (Cr), molybdenum (Mo), platinum (Pt), nickel (Ni), and an alloy thereof.

The transparent conductive film may include a transparent conductive oxide. For example, the transparent conductive film may include at least one transparent conductive oxide among indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The light emitting layer EML may be disposed on an exposed surface of the first electrode AD. The light emitting layer EML may have a multilayer thin film structure including a light generation layer (LGL). For example, the light emitting layer EML may include a hole injection layer (HIL) for injecting holes, a hole transport layer (HTL) having excellent transportability of holes and for increasing a recombination opportunity of holes and electrons by suppressing movement of electrons that are not combined in the light generation layer, the light generation layer for emitting light by the recombination of the injected electrons and holes, a hole blocking layer (HBL) for suppressing the movement of the holes that are not combined in the light generation layer, an electron transport layer (ETL) for smoothly transporting the electrons to the light generation layer, and/or an electron injection layer (EIL) for injecting the electrons.

A color of the light generated in the light generation layer may be one of red, green, blue, and white, but the inventive concepts are not limited thereto. For example, the color of the light generated in the light generating layer of the light emitting layer EML may be one of magenta, cyan, and yellow.

The hole injection layer, the hole transport layer, the hole blocking layer, the electron transport layer, and the electron injection layer may be a common film connected with each other in adjacent light emission areas.

The second electrode CD may be a transflective film. For example, the second electrode CD may be a thin film metal layer having a thickness enough to transmit the light emitted from the light emitting layer EML. For example, the second electrode CD may transmit some of the light emitted from the light emitting layer EML and reflect the remains of the light emitted from the light emitting layer EML.

In an embodiment, the second electrode CD may include a material having a work function lower than that of the transparent conductive film. For example, the second electrode CD may include at least one molybdenum (Mo), tungsten (W), silver (Ag), magnesium (Mg), aluminum (Al), platinum (Pt), palladium (Pd), nickel (Ni), neodymium (Nd), iridium (Ir), chromium (Cr), lithium (Li), calcium (Ca), and an alloy thereof.

Some of the light emitted from the light emitting layer EML may not transmit the second electrode CD and the light reflected from the second electrode CD may be reflected by the reflective film again. That is, the light emitted from the light emitting layer EML may resonate between the reflective film and the second electrode CD. A light extraction efficiency of the organic light emitting elements LD may be improved by the resonance of the light.

A pixel definition film (or bank layer) 117 for partitioning the light emission area of each pixel PXL may be provided on the first substrate SUB1 on which the first electrode AD and the like are disposed. The pixel definition film 117 may expose an upper surface of the first electrode AD and may be protruded from the first substrate SUB1 along a circumference of each light emission area.

The light emitting layer EML may be provided in the light emission area of each pixel PXL surrounded by the pixel definition film 117 and the second electrode CD may be provided on the light emitting layer EML. One of the first electrode AD and the second electrode CD may be an anode electrode and the other may be a cathode electrode. For example, the first electrode AD may be an anode electrode, and the second electrode CD may be a cathode electrode.

The pixel definition film 117 may include an organic insulating material. For example, the pixel definition film 117 may include at least one of polystyrene, polymethylmethacrylate (PMMA), polyacrylonitrile (PAN), polyamide (PA), polyimide (PI), polyarylether (PAE), heterocyclic polymer, parylene, epoxy, benzocyclobutene ("BCB"), siloxane based resin, and silane based resin.

The first protective layer PTL1 covering the second electrode CD may be provided on the second electrode CD. The first protective layer PTL1 may be configured of a thin film encapsulation layer. In an embodiment, the thin film encapsulation layer may be replaced with another type of encapsulation film, encapsulation substrate, protective film of at least one layer, or the like.

The thin film encapsulation layer may prevent or reduce oxygen and moisture from penetrating into the light emitting element LD. To this end, the thin film encapsulation layer may include an inorganic film. The inorganic film may include at least one of silicon oxide, silicon nitride, silicon oxynitride, aluminum oxide, titanium oxide, zirconium oxide, and tin oxide.

Each of the circuit elements and the wires disposed on the first surface of the first substrate SUB1 from the buffer layer 112 to the protective layer 116 may configure the circuit element layer BPL of the display device 10 and/or the fingerprint sensor. In addition, the light emitting elements LD disposed in each pixel PXL from the first electrode AD to the second electrode CD and the thin film encapsulation layer disposed between the light emitting elements LD may configure the light emitting element layer LDL of the display device 10 and/or the fingerprint sensor.

Further referring to FIGS. 15 to 18, the pixel PXL according to the embodiment may include the first opening LTH1 defined by non-overlapping of the conductive layers (and the semiconductor layers) in the circuit element layer BPL. The sensing area SA may include a plurality of pixels PXL including the first opening LTH1.

That is, the first opening LTH1 may be formed by non-overlapping of the conductive layers (and the semiconductor layers) stacked in a vertical direction in the circuit element layer BPL. For example, the first opening LTH1 may be formed by non-overlapping of the semiconductor layer in which the active pattern ACT of the circuit element layer BPL is disposed, the first conductive layer in which the gate electrodes GE1 to GE7 are disposed, the second conductive layer in which the second capacitor electrode UE and the like are disposed, the third conductive layer in which the power line PL and the like are disposed, and the third conductive layer in which the bridge pattern BRP and the like are disposed.

The first opening LTH1 may be an opening region defined by a portion of the power line PL including at least one region of the first protrusion portions PRT1-1 and PRT1-2, a portion of the initialization power line IPL including at least one region of the second protrusion portion PRT2, a portion of the light emission control line Ei, a portion of the bridge pattern BRP including at least one region of the third protrusion portion PRT3, a portion of the fifth source electrode SE5, and a portion of the sixth drain electrode DE6.

The first opening LTH1 may have a planar closed loop shape. At least a portion of the closed loop shape may include a curve, or an internal angle of the at least a portion of the closed loop shape may be an obtuse angle. The first opening LTH1 may have a polygonal planar shape and the internal angle that is an obtuse angle, in correspondence with the angular shapes of the first to third protrusion portions PRT1 to PRT3. For example, the first opening LTH1 may have an approximately octagonal planar shape as shown in FIG. 15. However, the inventive concepts are not limited thereto.

When the first opening LTH1 is formed between the wires and/or the conductive layers on which the protrusion portions are not formed, the first opening LTH1 has an approximately rectangular planar shape. At this time, when diffraction of the incident light occurs at edges of the wires and/or the conductive layers forming the first opening LTH1, accurate fingerprint detection may not be performed by the sensor layer PSL. Such diffraction occurs more severely when an acute angle is formed between the wires and/or the conductive layers.

As shown in FIGS. 15, 16, and 17, when the first opening LTH1 has an approximately octagonal shape, an angle between the wires and/or the conductive layers forming the first opening portion LHT1 forms an obtuse angle. Therefore, the diffraction of the incident light at the edge of the first opening LTH1 may be reduced.

According to the above-described embodiment, an opening array for receiving the reflected light integrally with the light emitting element layer LDL and the circuit element layer BPL may be formed without forming an additional layer inside the circuit element layer BPL. Therefore, the module thickness of the display device 10 may be reduced.

Meanwhile, in various embodiments, an arrangement and a shape of the first opening LTH1 are not limited to those shown in FIGS. 15 to 17. That is, in other various embodiments, the first opening LTH1 may be formed in another region, for example, a region including the opening portion OPN formed in the first gate electrode GE1. In such an embodiment, a layout structure may be variously modified so that the conductive layer is not disposed in the first opening LTH1.

A width (size, or diameter) w of the first opening LTH1 may be determined by a size of the opening portions (or opening portion regions). For example, the width w of the first opening LTH1 may be determined as the smallest width among widths of the opening portions. In an embodiment, the width w of the first opening LTH1 in the first direction DR1 may be smaller than a width (not shown) in the second direction DR2, but the inventive concepts are not limited thereto.

In an embodiment, the opening portions forming the first opening LTH1 may overlap at least one region of the pinholes PIH of the light blocking layer PHL. When the first opening LTH1 has an approximately octagonal shape, the pinholes PIH formed in the light blocking layer PHL may have an approximately octagonal shape in correspondence with the shape of the first opening LTH1. In such an embodiment, the size of the first opening LTH1 may be the same as or different from a size of the pinhole PIH.

In an embodiment in which the first opening portions LTH1 have a size smaller than that of the pinholes PIH, the first opening array layer LTHL1 may perform the light control layer LBL that controls the path of the light (for example, limits the field of view of the reflected light to a predetermined angle range), and the light blocking layer PHL may perform the light blocking function.

However, the inventive concepts are not limited thereto. That is, in another embodiment, in one embodiment, the size of the first opening LTH1 may be larger than the size of the pinhole PIH. In such an embodiment, the first opening array layer LTHL1 may perform the light blocking function, and the light blocking layer PHL may perform the function of the light control layer LBL that controls the path of the light.

Figure 19:
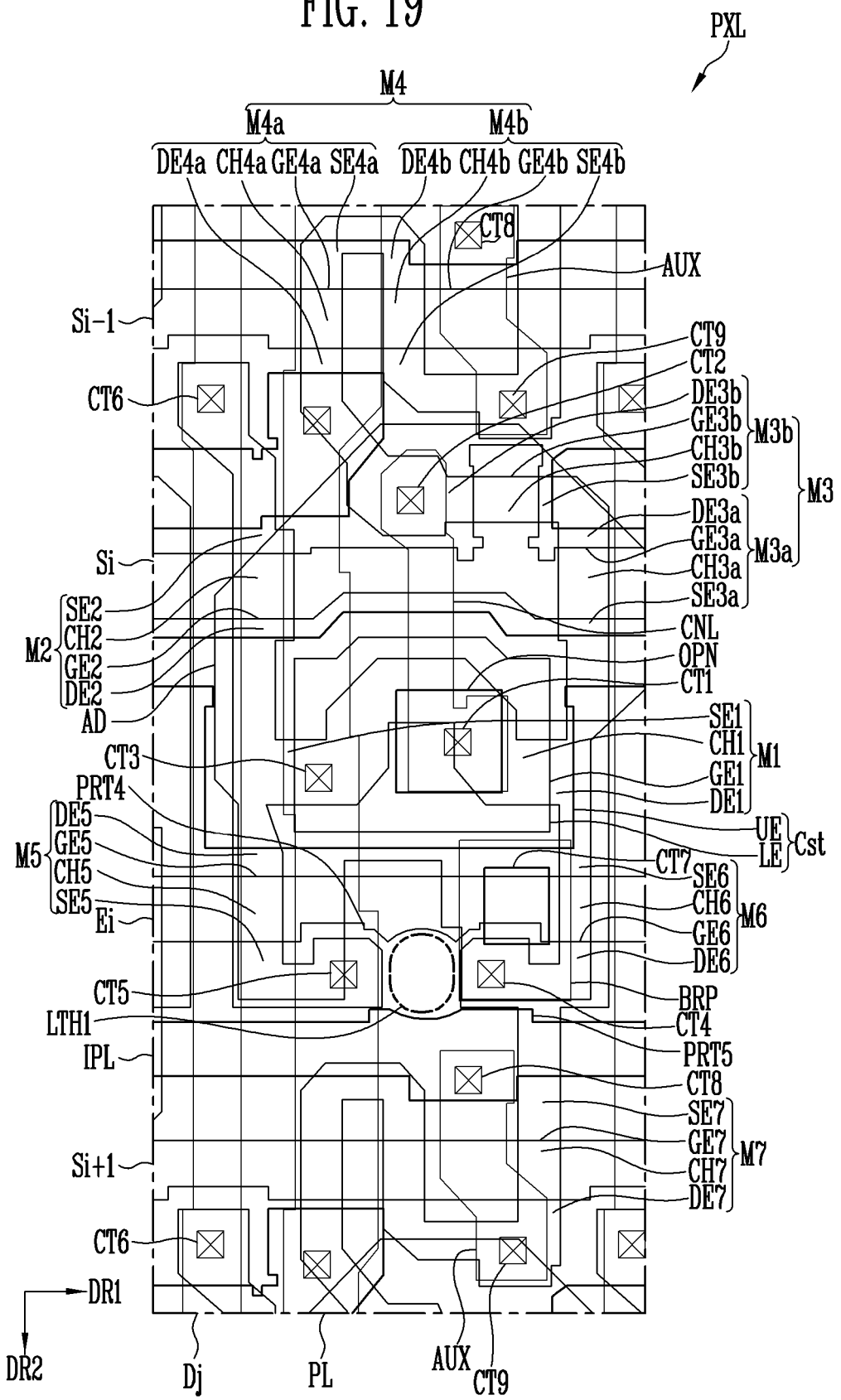
FIG. 19 is a plan view illustrating another embodiment of the layout of the pixel shown in FIG. 14.
Figure 20:
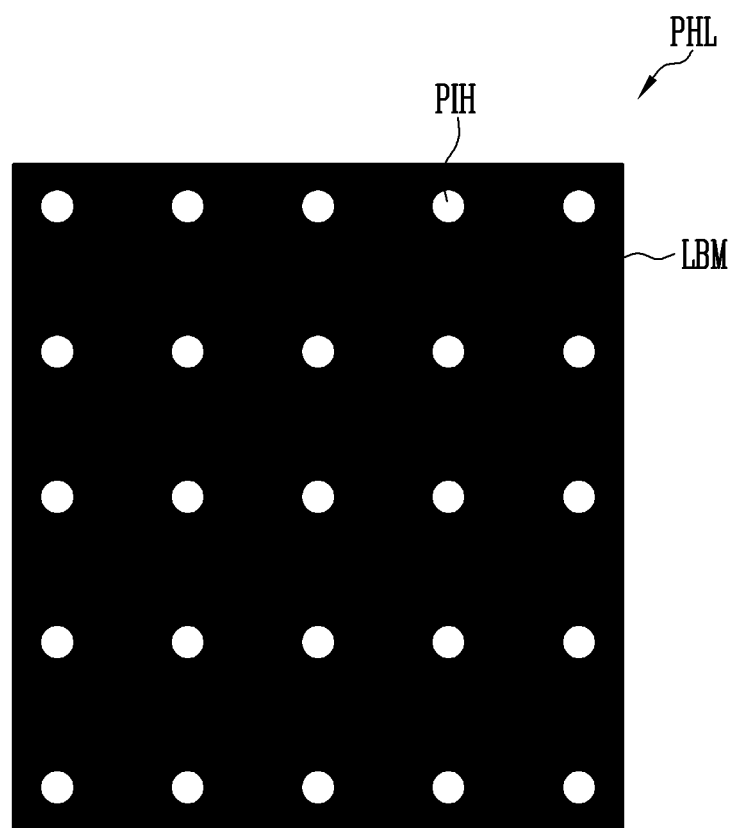
FIG. 20 is a plan view illustrating a light blocking layer according to the embodiment of FIG. 19.

FIG. 19 is a plan view illustrating another embodiment of the layout of the pixel shown in FIG. 14. FIG. 20 is a plan view illustrating a light blocking layer according to the embodiment of FIG. 19.

The embodiment of FIGS. 19 and 20 are substantially the same as the embodiment described with reference to FIGS. 15 to 18 except that the first opening LTH1 and the pinhole PIH have a circular or elliptical shape as compared with the embodiment described with reference to FIGS. 15 to 18. Therefore, the same components as those shown in FIGS. 15 to 18 are denoted by the same reference numerals and detailed description thereof will be omitted.

In the embodiment of FIG. 19, the power line PL, the initialization power line IPL, and the bridge pattern BRP do not include the first to third protrusion portions PRT1, PRT2, and PRT3 described in the embodiment of FIG. 15. Instead, a fourth protrusion portion PRT4 and a fifth protrusion portion PRT5 are formed on the light emission control line Ei and the initialization power line IPL, respectively.

Specifically, the light emission control line Ei may have a shape protruding in the second direction DR2 in at least one region. For example, the light emission control line Ei may include the fourth protrusion portion PRT4 formed in the second direction DR2. The fourth protrusion portion PRT4 may be formed to be adjacent to the fifth source electrode SE5 and the sixth drain electrode DE6. That is, the fourth protrusion portion PRT4 may have a shape extending in the first direction DR1 from an area adjacent to the fifth contact hole CT5 to an area adjacent to the sixth contact hole CT6.

In an embodiment, a protrusion surface of the fourth protrusion portion PRT4 may have a pattern in which at least a portion thereof is etched. For example, the protrusion surface of the fourth protrusion portion PRT4 may have a planar curved shape. Here, the protrusion surface may be a surface corresponding to a spaced area between the fifth source electrode SE5 and the sixth drain electrode DE6. That is, the fourth protrusion portion PRT4 may include a curve portion corresponding to the curve portion of the first opening LTH1 (or the closed loop shape of the first opening LTH1) in plan view.

The initialization power line IPL may have a shape protruding in a direction opposite to the second direction DR2 in at least one region. For example, the initialization power line IPL may include the fifth protrusion portion PRT5 formed in the direction opposite to the second direction DR2. The fifth protrusion portion PRT5 may be formed to be adjacent to the fifth source electrode SE5 and the sixth drain electrode DE6. That is, the fifth protrusion portion PRT5 may have a shape extending in the first direction DR1 from an area adjacent to the fifth contact hole CT5 to an area adjacent to the sixth contact hole CT6. In particular, the fifth protrusion portion PRT5 may be disposed to face at least one region of the fourth protrusion portion PRT4.

In an embodiment, a protrusion surface of the fifth protrusion portion PRT5 may have a pattern in which at least a portion thereof is etched. For example, the protrusion surface of the fifth protrusion portion PRT5 may have a curved shape. Here, the protrusion surface etched to have the curved shape may be a surface corresponding to a spaced area between the fifth source electrode SE5 and the sixth drain electrode DE6. In addition, the protrusion surface etched to have the curved shape may be disposed to face the protrusion surface etched in the curved shape of the fourth protrusion portion PRT4. That is, the fifth protrusion portion PRT5 may include a curve portion corresponding to the curve portion of the first opening LTH1 (or the closed loop shape of the first opening LTH1) in plan view.

In the above-described embodiment, the fifth source electrode SE5 and/or the sixth drain electrode DE6 may have a shape corresponding to the shape of the fourth protrusion portion PRT4 and the fifth protrusion portion PRT5 in at least one region adjacent to the fourth protrusion portion PRT4 and/or the fifth protrusion portion PRT5. For example, the fifth source electrode SE5 and the sixth drain electrode DE6 may have a shape in which an edge thereof is etched in at least one region adjacent to the fourth protrusion portion PRT4 and/or the fifth protrusion portion PRT5.

The first opening portion LTH1 may be an opening region defined by at least a portion (for example, the protrusion surface) of the fourth protrusion portion PRT4, a portion of the power line PL, at least a portion (for example, the protrusion surface) of the fifth protrusion portion PRT5, a portion of the bridge pattern BRP, a portion of the fifth source electrode SE5, and a portion of the sixth drain electrode DE6. The first opening LTH1 may have an approximately circular or elliptical planar shape corresponding to a planar curved shape of the protrusion surfaces (or curved portions) of the fourth protrusion portion PRT4 and the fifth protrusion portion PRT5.

As shown in FIG. 19, when the first opening LTH1 has the approximately circular or elliptical shape, diffraction of incident light at the edge of the first opening LTH1 forming the first opening portion LHT1 may be minimized.

In an embodiment, at least one region of the first opening LTH1 may overlap the pinholes PIH of the light blocking layer PHL. When the first opening LTH1 has the approximately circular or elliptical shape, the pinholes PIH formed in the light blocking layer PHL may have an approximately circular or elliptical shape corresponding to the shape of the first opening LTH1. In such an embodiment, the size of the first opening LTH1 may be the same as or different from the size of the pinhole PIE.

Figure 21:
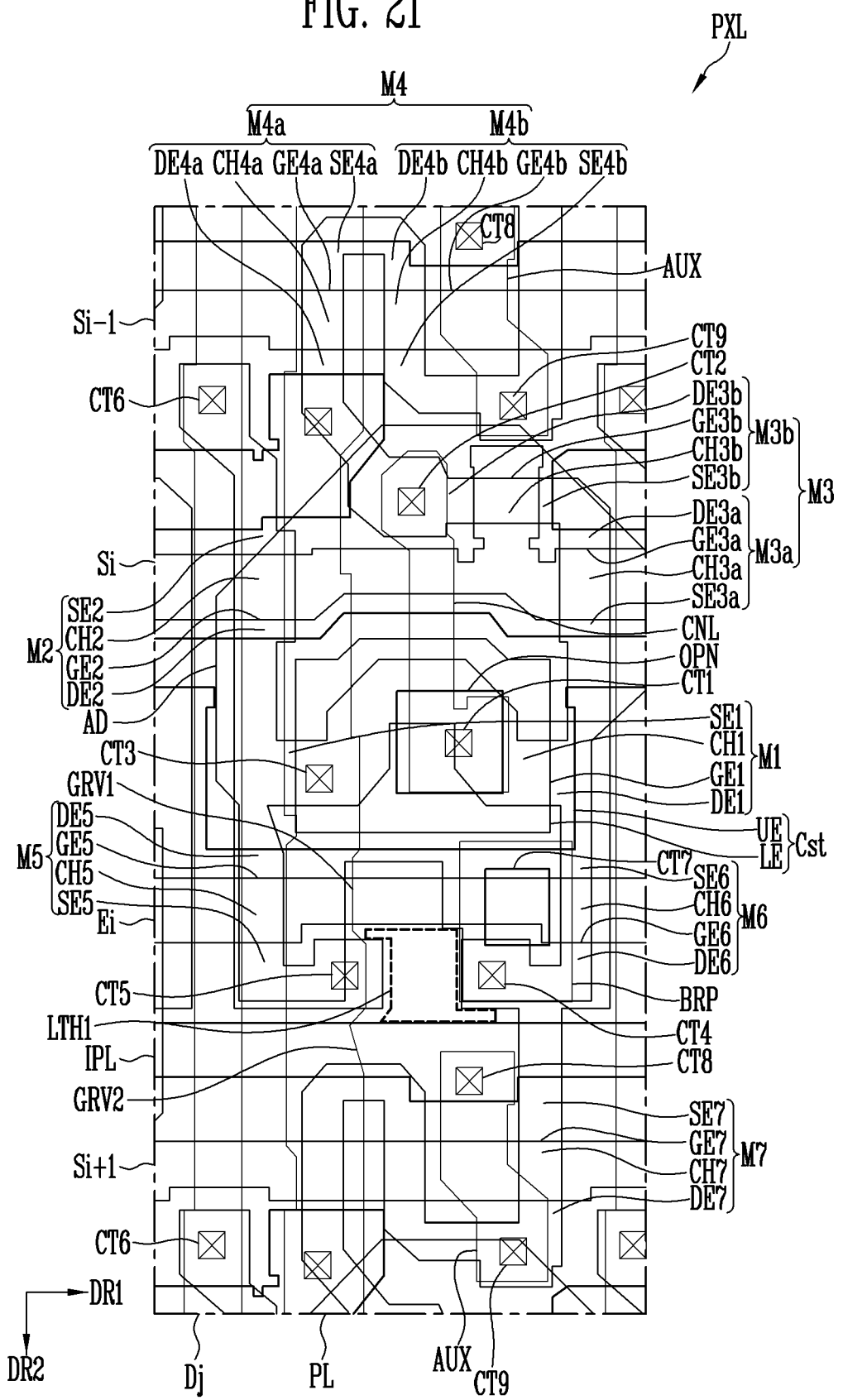
FIG. 21 is a plan view illustrating still another embodiment of the layout of the pixel shown in FIG. 14.

FIG. 21 is a plan view illustrating still another embodiment of the layout of the pixel shown in FIG. 14.

The embodiment of FIG. 21 is substantially the same as the embodiment described with reference to FIGS. 15 to 18 except that the first opening LTH1 and the pinhole PIH have an arbitrary polygon as compared with the embodiment described with reference to FIGS. 15 to 18. Therefore, the same components as those shown in FIGS. 15 to 18 are denoted by the same reference numerals and detailed description thereof will be omitted.

In the embodiment of FIG. 21, the power line PL, the initialization power line IPL, and the bridge pattern BRP do not include the first to third protrusion portions PRT1, PRT2, and PRT3 described in the embodiment of FIG. 15. Instead, the power line PL includes a first groove portion GRV1 and a second groove portion GRV2.

Specifically, the power line PL may have a groove portion etched in at least one region. For example, the power line PL may include the first groove portion GRV1 and the second groove portion GRV2 formed to be spaced apart at a predetermined distance. For example, at least a portion of the first groove portion GRV1 may overlap the light emission control line Ei. For example, at least a portion of the second groove portion GRV2 may overlap the initialization power line IPL. The groove portions GRV1 and GRV2 may have an angular shape. For example, the groove portions GRV1 and GRV2 may have various planar shapes, such as a semi-hexagonal shape (or a trapezoidal shape), a quadrangle, and a triangle.

At this time, when a resistance of the power line PL is increased by the groove portions GRV1 and GRV2 formed in the power line PL, sufficient power may not be supplied to the pixel PXL through the power line PL. Therefore, in order to reduce the resistance of the power line PL, a protrusion portion may be formed in at least one region so that a thickness of the power line PL may be sufficiently maintained. For example, the power line PL may include the protrusion portion at a facing position of the groove portions GRV1 and GRV2. The protrusion portion may have a mirrored shape with respect to the groove portions GRV1 and GRV2 or may have a different shape. By the protrusion portion, a width of the second direction DR2 of the power line PL may be set to about 2 μm to 5 μm even at a position where the groove portions GRV1 and GRV2 are formed.

Continuously referring to FIG. 21, the initialization power line IPL is spaced apart from the bridge pattern BRP and the sixth drain electrode DE6 at a preset distance. That is, the initialization power line IPL does not overlap the bridge pattern BRP and the sixth drain electrode DE6. In addition, the initialization power line IPL is spaced apart from the fifth source electrode SE5 at a preset distance. Such an arrangement extends the area of the first opening LTH1 surrounded by the second initialization power line IPL, the bridge pattern BRP, the fifth source electrode SE5 and the sixth drain electrode DE6.

The first opening LTH1 may be an opening portion defined by a portion of the power line PL including at least one region of the first groove portion GRV1 and the second groove portion GVR2, a portion of the light emission control line Ei, a portion of the bridge pattern BRP, a portion of the initialization power line IPL, a portion of the fifth source electrode SE5, and a portion of the sixth drain electrode DE6. The first opening LTH1 may have a polygonal shape corresponding to the angular shape of the first groove portion GRV1 and the second groove portion GVR2. For example, at least some of vertices of the first opening LTH1 forming the polygonal shape may have an acute angle, and others may have an obtuse angle. At least some of the vertices of the first opening LTH1 forming the polygonal shape may have a right angle.

In comparison with the case where the groove portions GRV1 and GRV2 are not formed in the power line PL, the first opening LTH1 of the embodiment shown in FIG. 21 has a larger area. When the area of the first opening LTH1 is increased, amount of light incident through the first opening LTH1 is increased. As a result, amount of light obtained in the sensor layer PSL is increased. When fingerprint detection is performed using larger amount of light, accuracy of the fingerprint detection may be improved.

At least one region of the opening portions forming the first opening LTH1 may overlap the pinholes PIE of the light blocking layer PHL. When the first opening LTH1 has the polygonal shape, the pinholes PIE formed in the light blocking layer PHL may have a polygonal shape the same as or different from that of the first opening LTH1. In such an embodiment, the size of the first opening LTH1 may be the same as or different from the size of the pinhole PIE.

Some of the advantages that may be achieved by exemplary embodiments of the invention include a fingerprint sensor and the display device including the same that may reduce a module thickness of the display device by forming a light transmission area integrally with the circuit element layer in the fingerprint sensor for the light sensing method. In addition, the fingerprint sensor and the display device including the same according to exemplary embodiments of the invention may prevent or reduce diffraction of light that may occur in the light transmission area formed in the circuit element layer.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A fingerprint sensor comprising:
a substrate;
a circuit element layer disposed on a first surface of the substrate, the circuit element layer including a semiconductor layer, conductive layers, and a first opening portion;
a light emitting element layer disposed on the circuit element layer, the light emitting element layer including a light emitting element;
a sensor layer disposed on a second surface of the substrate, the sensor layer including a light sensor corresponding to the first opening portion; and
a light blocking layer disposed between the substrate and the sensor layer and including a second opening portion corresponding to the first opening portion,
wherein:
the first opening portion is defined as a closed loop by non-overlapping of the semiconductor layer and the conductive layers in plan view; and
in plan view, an area of the second opening portion is larger than an area of the first opening portion.

2. The fingerprint sensor according to claim 1, wherein:
in plan view, the first opening portion, the second opening portion, and the light sensor overlap; and
in plan view, the first opening portion does not overlap the light emitting element.

3. The fingerprint sensor according to claim 1, wherein at least a portion of the closed loop includes a curve, or an internal angle of the at least the portion of the closed loop is an obtuse angle.

4. The fingerprint sensor according to claim 1, wherein an internal angle of at least a portion of the closed loop is an acute angle.

5. The fingerprint sensor according to claim 1, wherein the conductive layers comprises:
a first conductive layer including first electrodes extending in a first direction;
a second conductive layer disposed on the first conductive layer, the second conductive layer including second electrodes extending in the first direction; and
a third conductive layer disposed on the second conductive layer, the third conductive layer including third electrodes extending in a second direction perpendicular to the first direction,
wherein the first opening portion is positioned between the first electrodes, between the second electrodes, and between the third electrodes in plan view.

6. The fingerprint sensor according to claim 5, wherein:
the first electrodes include a first wire extending in the first direction;
the second electrodes include a second wire spaced apart from the first wire in plan view by a preset distance, the second wire extending in the first direction;
the third electrodes include a third wire extending in the second direction and a bridge pattern spaced apart from the third wire; and
the first opening portion is defined by a portion of the first wire, a portion of the second wire, a portion of the third wire, and a portion of the bridge pattern.

7. The fingerprint sensor according to claim 6, wherein:
the third wire includes at least two first protrusion portions protruding toward the bridge pattern in plan view; and
at least a portion of the closed loop is defined by the at least two first protrusion portions.

8. The fingerprint sensor according to claim 7, wherein the first protrusion portions partially overlap the first wire and the second wire, respectively.

9. The fingerprint sensor according to claim 8, wherein an internal angle of the closed loop corresponding to each of the first protrusion portions is an obtuse angle.

10. The fingerprint sensor according to claim 9, wherein one side of each of the first protrusion portions extends in a direction crossing each of the first direction and the second direction.

11. The fingerprint sensor according to claim 10, wherein at least one of the first protrusion portions has a trapezoidal planar shape.

12. The fingerprint sensor according to claim 7, wherein:
the second wire includes at least one second protrusion portion protruding toward the first wire in plan view;
the second protrusion portion does not overlap the third wire; and
the first and second protrusion portions correspond to at least a portion of the closed loop.

13. The fingerprint sensor according to claim 12, wherein:
the bridge pattern includes at least one third protrusion portion protruding toward the third wire in plan view;
the third protrusion portion overlaps the first wire; and
the first, second, and third protrusion portions correspond to the at least the portion of the closed loop.

14. The fingerprint sensor according to claim 13, wherein the first opening portion has an octagonal planar shape.

15. The fingerprint sensor according to claim 6, wherein:
the first wire includes at least one fourth protrusion portion protruding in the second direction; and
the fourth protrusion portion includes a curve portion corresponding to the curve of the closed loop.

16. The fingerprint sensor according to claim 15, wherein:
the second wire includes a fifth protrusion portion protruding in a direction opposite to the second direction; and
the fifth protrusion portion includes a curve portion that faces the fourth protrusion portion and corresponds to the curve of the closed loop.

17. The fingerprint sensor according to claim 16, wherein the first opening portion has a planar shape of a circle or an ellipse.

18. The fingerprint sensor according to claim 6, wherein:
the third wire includes at least two groove portions;
the at least two groove portions partially overlap the first wire and the second wire, respectively; and
an internal angle of the closed loop corresponding to the at least two groove portions is an acute angle.

19. The fingerprint sensor according to claim 18, wherein the second wire does not overlap the bridge pattern.

20. The fingerprint sensor according to claim 6, wherein:
the semiconductor layer includes active patterns including each of a source electrode and a drain electrode; and
the first opening portion is further defined by a portion of the active patterns.

* * * * *